(12) United States Patent
Bo

(10) Patent No.: US 11,526,248 B2
(45) Date of Patent: Dec. 13, 2022

(54) TOUCH PANEL AND TOUCH DISPLAY DEVICE WITH SENSING ELECTRODES FORMED BY A PLURALITY OF CONDUCTIVE LINES

(71) Applicant: BOE TECHNOLOGY GROUP CO., LTD., Beijing (CN)

(72) Inventor: Zewen Bo, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/419,585

(22) PCT Filed: Sep. 3, 2020

(86) PCT No.: PCT/CN2020/113284
§ 371 (c)(1),
(2) Date: Jun. 29, 2021

(87) PCT Pub. No.: WO2022/047704
PCT Pub. Date: Mar. 10, 2022

(65) Prior Publication Data
US 2022/0147186 A1  May 12, 2022

(51) Int. Cl.
*G06F 3/044* (2006.01)
*G06F 3/041* (2006.01)
(Continued)

(52) U.S. Cl.
CPC ........ *G06F 3/0446* (2019.05); *G02F 1/13338* (2013.01); *G02F 1/134345* (2021.01);
(Continued)

(58) Field of Classification Search
CPC .... G06F 3/0443; G06F 3/0412; G06F 3/0448; G06F 2203/04111–041112; G02F 1/13338; H01L 27/323
See application file for complete search history.

(56) References Cited

U.S. PATENT DOCUMENTS

2014/0216786 A1  8/2014  Zhou et al.
2015/0169116 A1  6/2015  Masuda
(Continued)

FOREIGN PATENT DOCUMENTS

| CN | 103425366 A | 12/2013 |
| CN | 203773525 U | 8/2014 |
| CN | 105278733 A | 1/2016 |

*Primary Examiner* — Liliana Cerullo
(74) *Attorney, Agent, or Firm* — IP & T Group LLP

(57) ABSTRACT

A touch panel includes a base, sensing electrodes disposed on the base, and at least two touch lines disposed on the base and crossing a sensing electrode in the sensing electrodes. The sensing electrode includes a plurality of first conductive lines that are substantially parallel to each other and a plurality of second conductive lines that are substantially parallel to each other. The at least two touch lines are substantially parallel to the plurality of first conductive lines. The at least two touch lines include first touch line(s) electrically connected to the sensing electrode and second touch line(s) not electrically connected to the sensing electrode. An orthographic projection of each second touch line on the base is non-overlapping with orthographic projections of the plurality of first conductive lines on the base.

19 Claims, 16 Drawing Sheets

(51) Int. Cl.
*G02F 1/1343* (2006.01)
*G02F 1/1333* (2006.01)
*H01L 27/32* (2006.01)

(52) U.S. Cl.
CPC .......... *G06F 3/0412* (2013.01); *G06F 3/0443* (2019.05); *G06F 3/04164* (2019.05); *H01L 27/323* (2013.01); *G06F 3/0448* (2019.05); *G06F 2203/04111* (2013.01); *G06F 2203/04112* (2013.01)

(56) References Cited

U.S. PATENT DOCUMENTS

| 2015/0355751 | A1  | 12/2015 | Kurasawa et al. |            |
|--------------|-----|---------|-----------------|------------|
| 2016/0224155 | A1* | 8/2016  | Kim ............ | G02F 1/1368 |
| 2020/0027929 | A1* | 1/2020  | Lee ............ | G06F 3/0446 |
| 2020/0142542 | A1* | 5/2020  | Kuriki ......... | G06F 3/0446 |
| 2020/0393936 | A1* | 12/2020 | Bok ............ | G06F 3/0446 |

* cited by examiner

TOUCH PANEL AND TOUCH DISPLAY DEVICE WITH SENSING ELECTRODES FORMED BY A PLURALITY OF CONDUCTIVE LINES

CROSS-REFERENCE TO RELATED APPLICATION

This application is a national phase entry under 35 USC 371 of International Patent Application No. PCT/CN2020/113284 filed on Sep. 3, 2020, which is incorporated herein by reference in its entirety.

TECHNICAL FIELD

The present disclosure relates to the field of touch technologies, and in particular, to a touch panel and a touch display device.

BACKGROUND

Since the rise of touch technology, due to its characteristics of simplicity, rapidness, humanization, and the like, the touch technology has been become more and more popular, and there are more and more products with a touch function on the market, such as mobile phones, tablet and notebook computers.

At present, the touch technology includes a mutual capacitance touch technique and a self-capacitance touch technique. In a case where the mutual capacitance touch technique is applied to a display device, a capacitive load of a mutual-capacitance touch electrode increases significantly as the display size increases, resulting in a decreased touch report rate and a decreased signal-to-noise ratio (SNR) at a size of pad (above 9 inches) or notebook (above 13 inches). Moreover, in a case where a function of a capacitive active pen is added to the touch technology, in a mutual capacitive touch design, especially in a large-size display device, the capacitive load of the touch electrode is high, a noise received by the touch electrode is serious, and an attenuation of a remote signal is severe, so that it is difficult to achieve the function of the active pen. In addition, at present, since requirements for a module structure of the display device are getting higher and higher, the module structure is getting thinner and thinner, the mutual capacitive touch technique is easy to cause problems under a low ground condition.

Relative to the mutual capacitive touch technique, the self-capacitance touch technique has obvious technical advantages in capacitive load, touch report rate, signal-to-noise ratio, and function of active pen under the low ground condition, and thus the self-capacitance touch technique has received more and more attention.

SUMMARY

In one aspect, a touch panel is provided. The touch panel includes a base, sensing electrodes disposed on the base, and at least two touch lines disposed on the base and crossing a sensing electrode in the sensing electrodes. The sensing electrode includes a plurality of first conductive lines that are substantially parallel to each other and a plurality of second conductive lines that are substantially parallel to each other. The plurality of second conductive lines and the plurality of first conductive lines intersect, and the plurality of second conductive lines electrically connect the plurality of first conductive lines together. The at least two touch lines are substantially parallel to the plurality of first conductive lines. The at least two touch lines include first touch line(s) electrically connected to the sensing electrode and second touch line(s) not electrically connected to the sensing electrode. An orthographic projection of each second touch line on the base is non-overlapping with orthographic projections of the plurality of first conductive lines in the sensing electrode on the base.

In some embodiments, at least one of the plurality of second conductive lines in the sensing electrode includes a plurality of conductive sections that are disconnected from one another, and at least one conductive section is connected to at least one first conductive line. The orthographic projection of the second touch line on the base is non-overlapping with orthographic projections of conductive sections of the plurality of conductive sections in addition to conductive sections for connecting the plurality of first conductive lines together on the base.

In some embodiments, a first touch line in the at least one first touch line is connected to at least two of the plurality of second conductive lines, and positions of the at least two of the plurality of second conductive lines connected with the first touch line are communicated.

In some embodiments, the sensing electrode includes a first region, and the at least two touch lines and first conductive lines located in the first region are arranged alternately.

In some embodiments, the sensing electrode further includes a second region located at at least one side of the first region in an extending direction of the plurality of second conductive lines. First conductive lines located in the second region are arranged continuously.

In some embodiments, in a case where at least one of the plurality of second conductive lines in the sensing electrode includes a plurality of conductive sections that are disconnected from one another, portions of the plurality of second conductive lines located in the second region are communicated, and a portion of the at least one of the plurality of second conductive lines in the sensing electrode located in the first region includes the plurality of conductive sections that are disconnected from one another.

In some embodiments, the sensing electrode includes two second regions. The two second regions are located at two opposite sides of the first region in the extending direction of the plurality of second conductive lines.

In some embodiments, the first region is a region occupied by the sensing electrode.

In some embodiments, the at least two touch lines include a plurality of effective touch lines used for transmitting sensing signals and a plurality of dummy touch lines not used for transmitting sensing signals.

In some embodiments, the plurality of dummy touch lines are evenly distributed in the first region of the sensing electrode. Or the first region includes a first sub-region and a second sub-region located at at least one side of the first sub-region in an extending direction of the plurality of second conductive lines. The plurality of effective touch lines are located in the first sub-region, and the plurality of dummy touch lines are located in the second sub-region.

In some embodiments, the at least two touch lines and the sensing electrode are arranged in different layers. The touch panel further includes an insulating layer disposed between the sensing electrode and the at least two touch lines. A first touch line in the at least one first touch line is connected to the sensing electrode through via hole(s) in the insulating layer.

In some embodiments, the at least two touch lines and the sensing electrodes are arranged in a same layer. In a case where positions of each second conductive line intersected with the second touch line are communicated, the second touch line is connected through a bridge at the intersection positions, and an insulating layer is provided between the bridge and the second conductive line; or the second conductive line is connected through a bridge at the intersection positions, and an insulating layer is provided between the bridge and the second touch line.

In some embodiments, at least one first conductive line and at least one second conductive line are bending lines each including a plurality of bending points. Section(s) of the at least one first conductive line is overlapped with section(s) of the at least one second conductive line.

In some embodiments, at least one touch line is a bending line including a plurality of bending points. Orthographic projection(s) of section(s) of the at least one touch line on the base are overlapped with orthographic projection(s) of section(s) of the at least one second conductive line on the base.

In another aspect, a touch display device is provided. The touch display device includes the touch panel as described in any one of the above embodiments.

In some embodiments, the touch display device has a display area. The display area includes a plurality of sub-pixel regions and a pixel defining region for defining the plurality of sub-pixel regions. The at least two touch lines and the sensing electrodes are located in the pixel defining region.

In some embodiments, the plurality of first conductive lines in the sensing electrode and the touch lines crossing the sensing electrode form a plurality of line groups. Two adjacent line groups have m sub-pixel regions therebetween, m is greater than or equal to 1, and m is a positive integer. Each line group includes at least one first conductive line and/or at least one touch line.

In some embodiments, orthographic projections of the sensing electrode and the touch lines crossing the sensing electrode in the touch panel on the base form a plurality of squares, and one sub-pixel region corresponds to one square.

In some embodiments, the touch display device is a self-luminous display device. The self-luminous display device further includes a display substrate and an encapsulation layer used for encapsulating the display substrate. The encapsulation layer is used as the base in the touch panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described are merely accompanying drawings of some embodiments of the present disclosure, and a person of ordinary skill in the art may obtain other drawings according to these drawings. In addition, the accompanying drawings to be described may be regarded as schematic diagrams, and are not limitations on an actual size of a product, an actual process of a method and an actual timing of a signal involved in the embodiments of the present disclosure.

DETAILED DESCRIPTION

Figure 1:
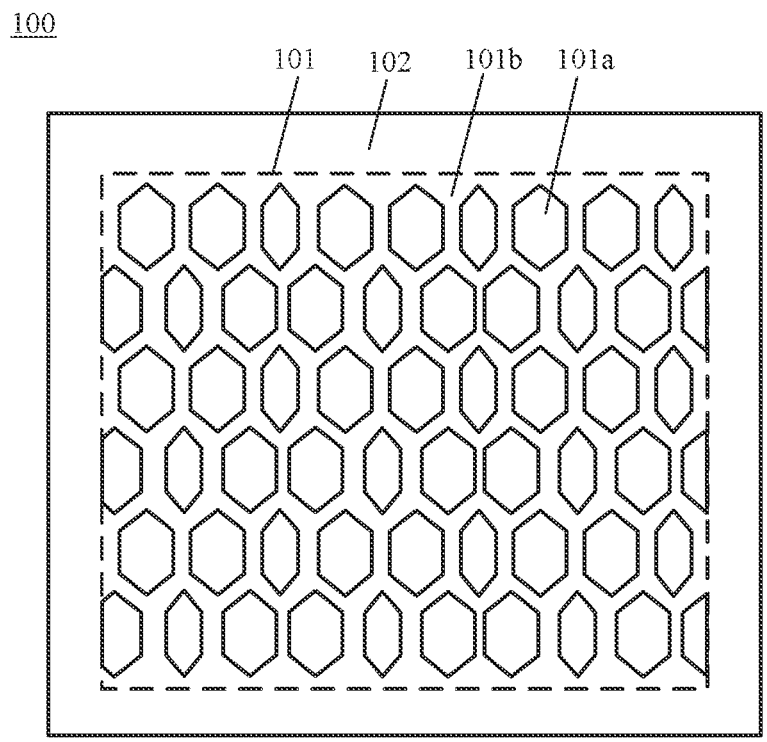
FIG. 1 is a region division diagram of a touch display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", and "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the present application, unless otherwise clearly specified and defined, the term "connected" should be broadly interpreted. For example, "connected" may be fixedly connected, detachably connected, or integrally connected. "Connected" may be directly connected, or indirectly connected through an intermediation. In addition, the term "electrically connected" may be directly electrically connected, or indirectly electrically connected through an intermediation.

The phrase "A and/or B" herein includes following three combinations: only A, only B, and a combination of A and B.

In addition, the use of the phrase "based on" is meant to be open and inclusive, in that a process, step, calculation or other action that is "based on" one or more of the stated conditions or values may, in practice, be based on additional conditions or values exceeding those stated.

The term "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shapes with respect to the drawings due to, for example, manufacturing techniques and/or tolerances may be conceivable. Therefore, the exemplary embodiments should not be construed to be limited to the shapes of the regions shown herein, but to include the deviations in shapes due to, for example, manufacturing. For example, an etched region that is shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

The embodiments of the present disclosure provide a touch display device. The touch display device may include, but is not limited to, a mobile phone, a tablet computer, a personal digital assistance (PDA) or a vehicle-mounted computer, and the use of the touch display device is not limited in the embodiments of the present disclosure.

As shown in FIG. 1, the touch display device 100 has a display area 101 and a peripheral area 102 located at at least one side of the display area 101. FIG. 1 illustrates an example in which the peripheral area 102 is around the display area 101. The display area 101 includes a plurality of sub-pixel regions 101*a* and a pixel defining region 101*b* for defining the plurality of sub-pixel regions 101*a*.

The plurality of sub-pixel regions 101*a* include, for example, red sub-pixel regions R, green sub-pixel regions G and blue sub-pixel regions B.

Here, the sub-pixel region 101*a* may be, for example, in a rectangular shape, or in a hexagon shape as shown in FIG. 1.

The types of the touch display device 100 are exemplarily described as follows. The touch display device 100 may be a liquid crystal display (LCD) device, and the touch display device 100 may also be a self-luminous display device. In a case where the touch display device 100 is the self-luminous display device, the self-luminous display device may be, for example, an organic light-emitting diode (OLED) display device or a quantum dot light-emitting diode (QLED) display device.

Figure 2A:
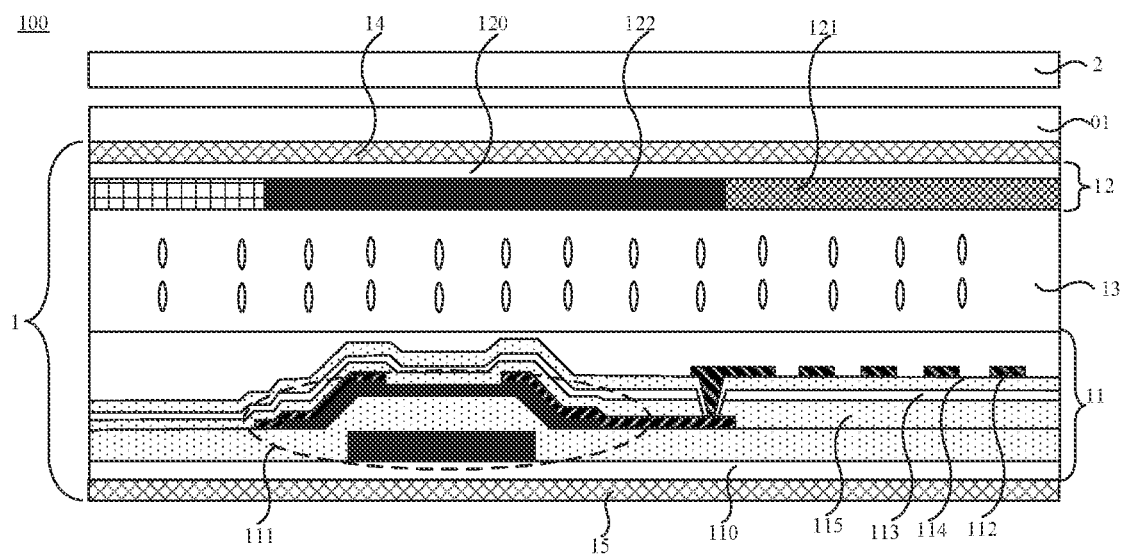
FIG. 2A is a structural diagram of a touch display device, in accordance with some embodiments.
Figure 2B:
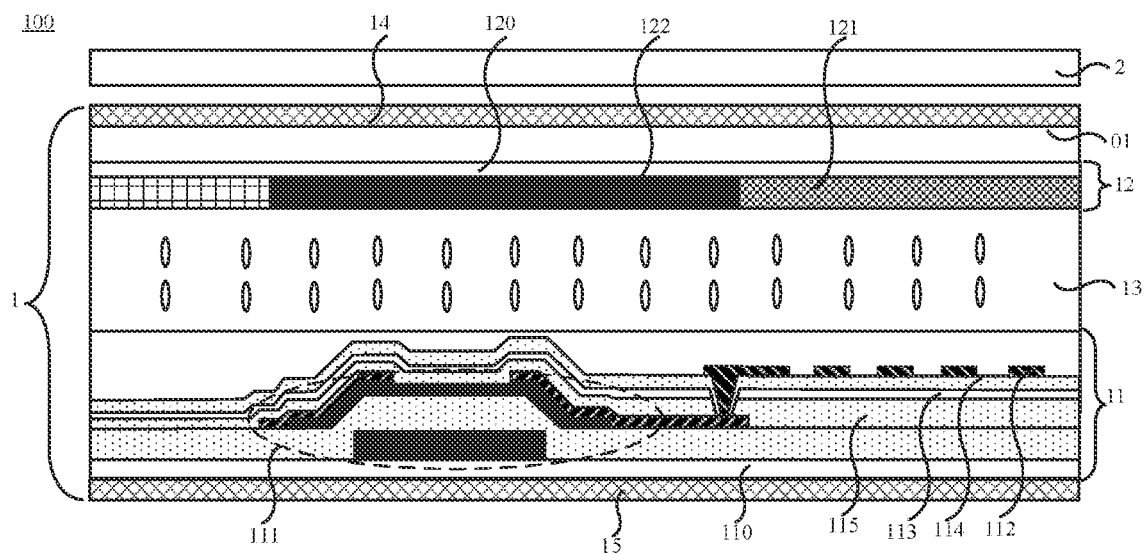
FIG. 2B is a structural diagram of a touch display device, in accordance with some other embodiments.
Figure 2C:
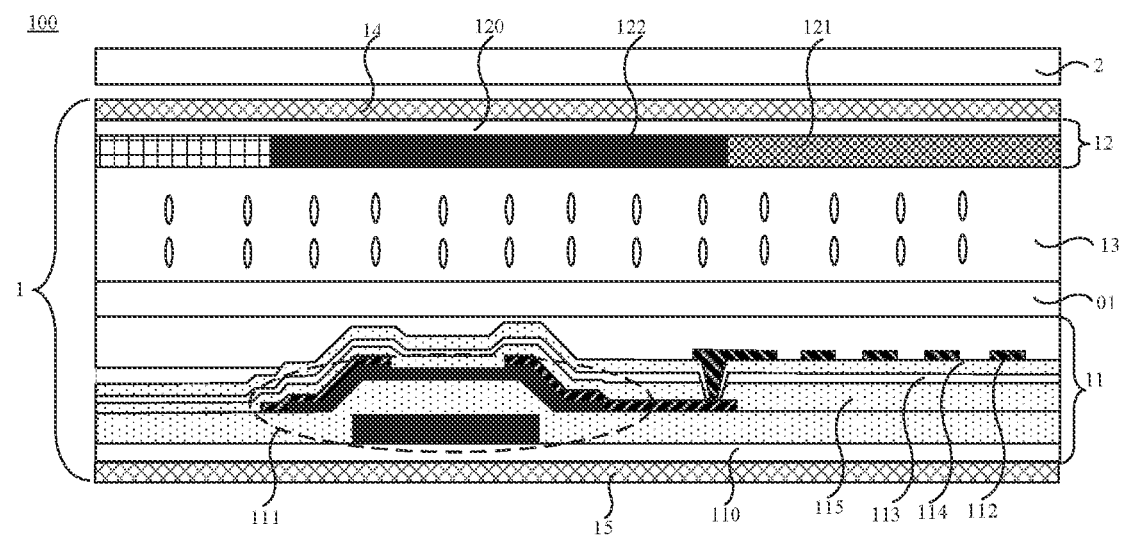
FIG. 2C is a structural diagram of a touch display device, in accordance with yet other embodiments.

In a case where the touch display device 100 is the liquid crystal display device, the liquid crystal display device includes a cover glass, a touch panel, a liquid crystal display panel and a backlight assembly. The backlight assembly is used for providing a light source for the liquid crystal display panel. As shown in FIGS. 2A, 2B and 2C, a main structure of the liquid crystal display panel 1 includes an array substrate 11, an opposing substrate 12 and a liquid crystal layer 13 disposed between the array substrate 11 and the opposing substrate 12.

As shown in FIGS. 2A, 2B and 2C, each sub-pixel region 101*a* of the array substrate 11 is provided with a thin film transistor 111 and a pixel electrode 112 located on a first base 110. The thin film transistor 111 includes an active layer, a source, a drain, a gate, and a gate insulating layer. The source and the drain are in contact with the active layer, and the pixel electrode 112 is electrically connected to the drain of the thin film transistor 111. In some embodiments, as shown in FIG. 2A, the array substrate 11 further includes a common electrode 113 disposed on the first base 110. The pixel electrode 112 and the common electrode 113 may be arranged in a same layer. In this case, the pixel electrode 112 and the common electrode 113 are each of a comb structure including a plurality of strip-shaped sub-electrodes. The pixel electrode 112 and the common electrode 113 may also be arranged in different layers. In this case, as shown in FIG. 2A, a first insulating layer 114 is disposed between the pixel electrode 112 and the common electrode 113. In a case where the common electrode 113 is disposed between the thin film transistor 111 and the pixel electrode 112, as shown in FIG. 2A, a second insulating layer 115 is further disposed between the common electrode 113 and the thin film transistor 111. In some other embodiments, the opposing substrate 12 includes a common electrode 113 disposed on a second base 120.

In some embodiments, the thin film transistor 111 may be a bottom-gate thin film transistor or a top-gate thin film transistor. The accompanying drawings of the embodiments of the present disclosure all illustrate an example in which the thin film transistor 111 is the bottom-gate thin film transistor.

As shown in FIGS. 2A, 2B and 2C, the opposing substrate 12 includes a second base 120 and a color filter layer 121 disposed on the second base 120. In this case, the opposing substrate 12 may also be referred to as a color filter (CF) substrate. The color filter layer 121 at least includes red photoresist units located in the red sub-pixel regions, green photoresist units located in the green sub-pixel regions and blue photoresist units located in the blue sub-pixel regions. The opposing substrate 12 further includes a black matrix pattern 122 disposed on the second base 120. The black matrix pattern 122 is used to separate the red, green and blue photoresist units.

As shown in FIGS. 2A, 2B and 2C, the liquid crystal display panel 1 further includes an upper polarizer 14 disposed on a side of the opposing substrate 12 away from the liquid crystal layer 13 and a lower polarizer 15 disposed on a side of the array substrate 11 away from the liquid crystal layer 13.

In some embodiments, as shown in FIG. 2A, the touch panel 01 is disposed outside the liquid crystal display panel 1, i.e., disposed between the cover glass 2 and the upper polarizer 14. In this case, the touch display device is referred to as an add-on touch display device. In some other embodiments, as shown in FIGS. 2B and 2C, the touch panel 01 is disposed in the liquid crystal display panel 1. In this case, the touch display device is referred to as an embedded touch display device. In a case where the touch panel 01 is disposed in the liquid crystal display panel 1, as shown in FIG. 2B, the touch panel 01 may be disposed between the upper polarizer 14 and the opposing substrate 12. In this case, the touch display device is referred to as an on-cell touch display device. Or, as shown in FIG. 2C, the touch panel 01 may be disposed between the first base 110 and the second base 120, for example, disposed on the first base 110. In this case, the touch display device is referred to as an in-cell touch display device.

Figure 3A:
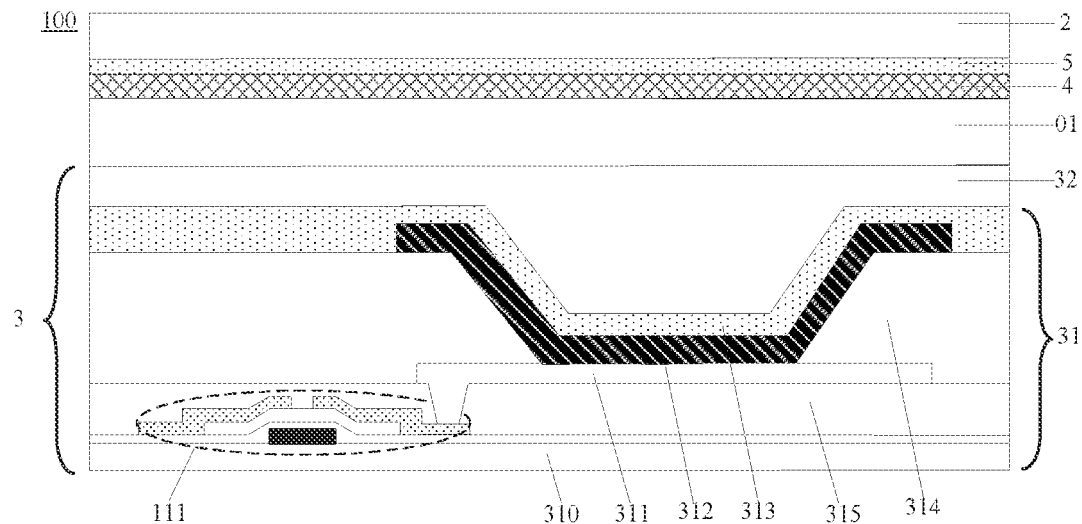
FIG. 3A is a structural diagram of a touch display device, in accordance with yet other embodiments.
Figure 3B:
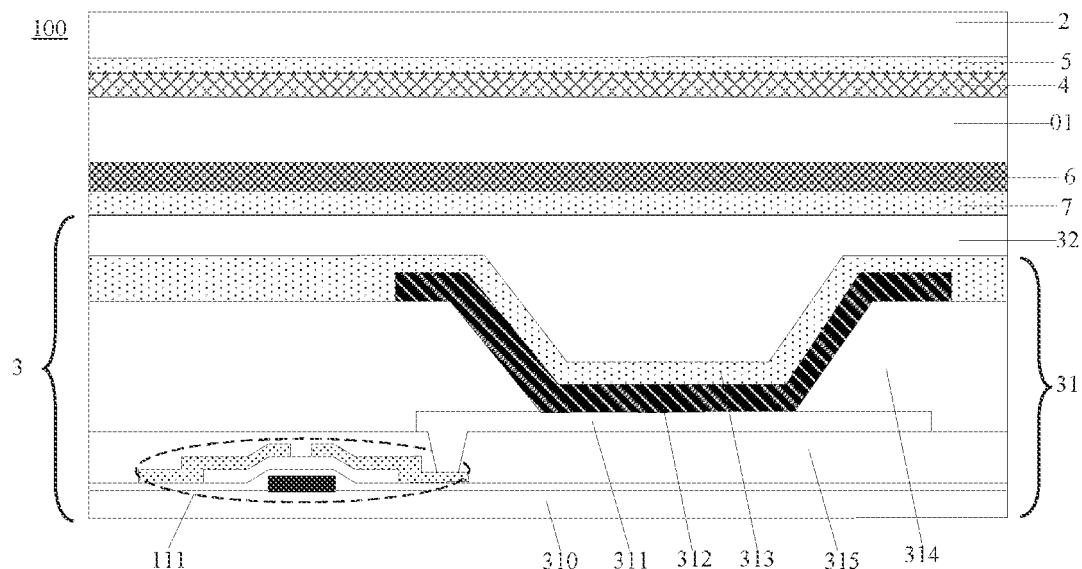
FIG. 3B is a structural diagram of a touch display device, in accordance with yet other embodiments.

In the case where the touch display device 100 is the self-luminous display device, as shown in FIGS. 3A and 3B, a main structure of the self-luminous display device includes a self-luminous display panel 3, a touch panel 01, a polarizer 4, a first optically clear adhesive (OCA) 5 and a cover glass 2 that are arranged in sequence.

The self-luminous display panel 3 includes a display substrate 31 and an encapsulation layer 32 for encapsulating the display substrate 31. Here, the encapsulation layer 32 may be an encapsulation film or an encapsulation substrate.

As shown in FIGS. 3A and 3B, the display substrate 31 includes a light-emitting device and a driving circuit that are disposed on a third base 310 in each sub-pixel region 101a. The driving circuit includes a plurality of thin film transistors 111. The light-emitting device includes an anode 311, a light-emitting functional layer 312 and a cathode 313. The anode 311 is electrically connected to a drain of a thin film transistor 111 that serves as a driving transistor in the plurality of thin film transistors 111. The display substrate 31 further includes a pixel defining layer (PDL) 314. The pixel defining layer 314 includes a plurality of opening regions, and one light-emitting device is disposed in one opening region.

In some embodiments, the light-emitting functional layer 312 includes a light-emitting layer. In some other embodiments, the light-emitting functional layer 312 further includes one or more of an electron transport layer (ETL), an electron injection layer (EIL), a hole transport layer (HTL) and a hole injection layer (HIL) in addition to the light-emitting layer.

As shown in FIG. 3A, the display substrate 31 further includes a planarization layer 315 disposed between the thin film transistors 111 and the anodes 311.

In the case where the touch display device 100 is the self-luminous display device, the touch display device 100 may be a top-emission display device. In this case, the anode 311 proximate to the third base 310 is opaque, and the cathode 313 away from the third base 310 is transparent or translucent. The touch display device 100 may also be a bottom-emission display device. In this case, the anode 311 proximate to the third base 310 is transparent or translucent, and the cathode 313 away from the third base 310 is opaque. The touch display device 100 may also be a double-sided emission display device. In this case, both the anode 311 proximate to the third base 310 and the cathode 313 away from the third base 310 are transparent or translucent.

Those skilled in the art should understand that, in the case where the touch display device 100 is the self-luminous display device, the touch display device 100 is easy to be manufactured into a flexible display device. In this case, the third base 310 is a flexible base.

In the case where the touch display device 100 is the self-luminous display device, in some embodiments, as shown in FIG. 3A, the touch panel 01 is directly disposed on the encapsulation layer 32. That is, the touch panel 01 and the encapsulation layer 32 have no other film layers therebetween. In some other embodiments, as shown in FIG. 3B, the touch panel 01 is disposed on a substrate 6, and the substrate 6 is attached to the encapsulation layer 32 through a second optically clear adhesive 7. Here, as shown in FIG. 3A, in a case where the touch panel 01 is directly disposed on the encapsulation layer 32, the thickness of the touch display device 100 is small, which is beneficial to achieve lightness and thinness.

The embodiments of the present disclosure further provide the touch panel 01, which may be applied to the touch display device 100. Of course, the touch panel 01 may also be applied to other touch devices.

Figure 4:
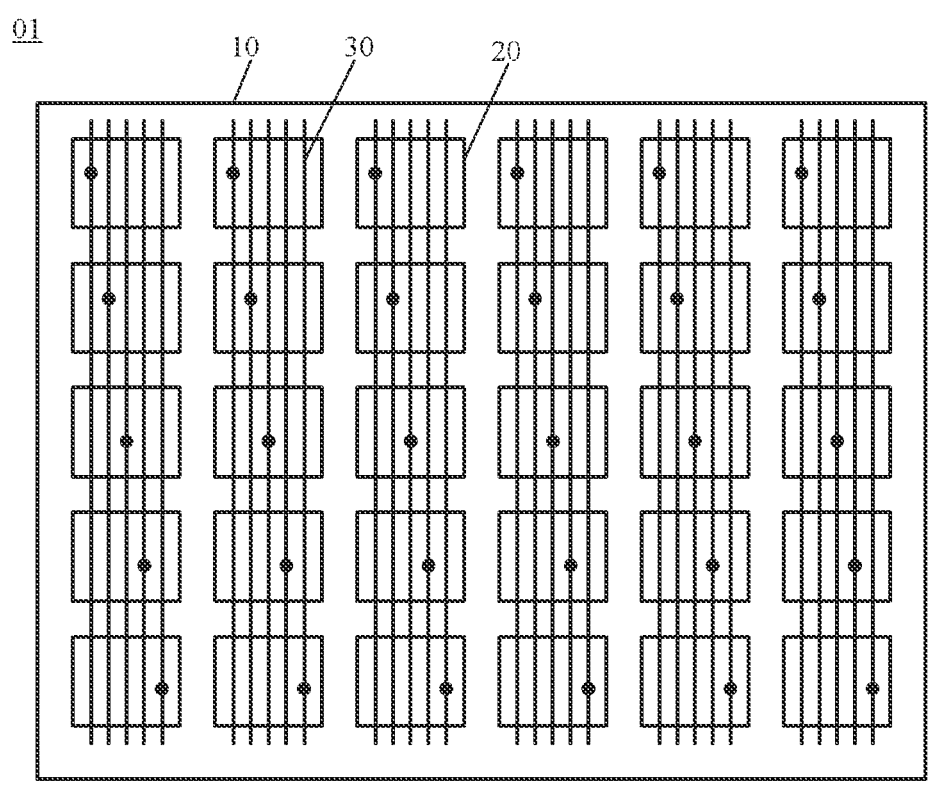
FIG. 4 is a structural diagram of a touch panel, in accordance with some embodiments.

Referring to FIG. 4, a main structure of the touch panel 01 includes a base 10, a plurality of sensing electrodes (also referred to as sensors) 20 that are disposed on the base 10 and independent from each other, and a plurality of touch lines 30. The touch line 30 crosses a plurality of sensing electrodes 20 in an extending direction thereof, and each sensing electrode 20 is electrically connected to at least one touch line 30.

Here, "independent from each other" means that the sensing electrodes 20 are not in contact with each other, and are not electrically connected.

In addition, any carrier layer capable of carrying the sensing electrodes 20 and the touch lines 30 may be used as the base 10 of the touch panel 01. In a case where the touch panel 01 is applied to the touch display device 100, the base 10 of the touch panel 01 may be separately arranged, or one or more layers in the display device may be multiplexed as the base 10 of the touch panel 01. For example, the touch display device 100 is the liquid crystal display device, and the touch panel 01 is disposed between the upper polarizer 14 and the opposing substrate 12. In this case, the second base 120 in the opposing substrate 12 may be multiplexed as the base 10 of the touch panel 01. For another example, the touch display device 100 is the self-luminous display device, and the touch panel 01 is directly disposed on the encapsulation layer 32. In this case, the encapsulation layer 32 may be multiplexed as the base 10 of the touch panel 01.

The touch panel 01 in the embodiments of the present disclosure is a self-capacitive touch panel, and a principle of the touch panel 01 for achieving touch is that: the sensing electrode 20 and the ground form a capacitance, i.e., self-capacitance. When a finger touches the touch panel 01, a capacitance of the finger will be superimposed on the sensing electrode 20, so that a capacitance value of the capacitance formed by the sensing electrode 20 and the ground changes. When a touch detection is performed, according to variations in the capacitance values of the capacitances formed by the plurality of sensing electrodes 20 and the ground before and after the touch, coordinates of a touch point may be determined, so as to achieve touch.

Below, one sensing electrode 20 is taken as an example to introduce the structure of the sensing electrode 20, positional relationship(s) and connection relationship(s) between the sensing electrode 20 and the touch line(s) 30.

Figure 5A:
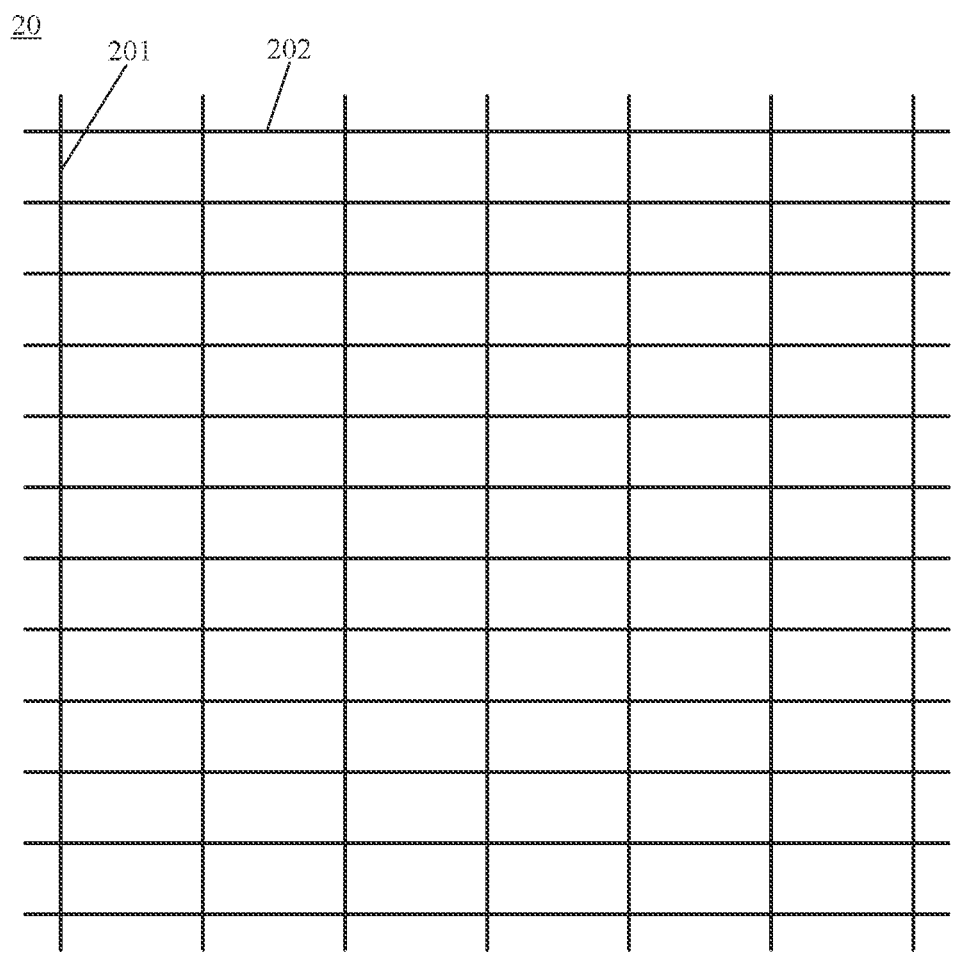
FIG. 5A is a structural diagram of a sensing electrode, in accordance with some embodiments.
Figure 5B:
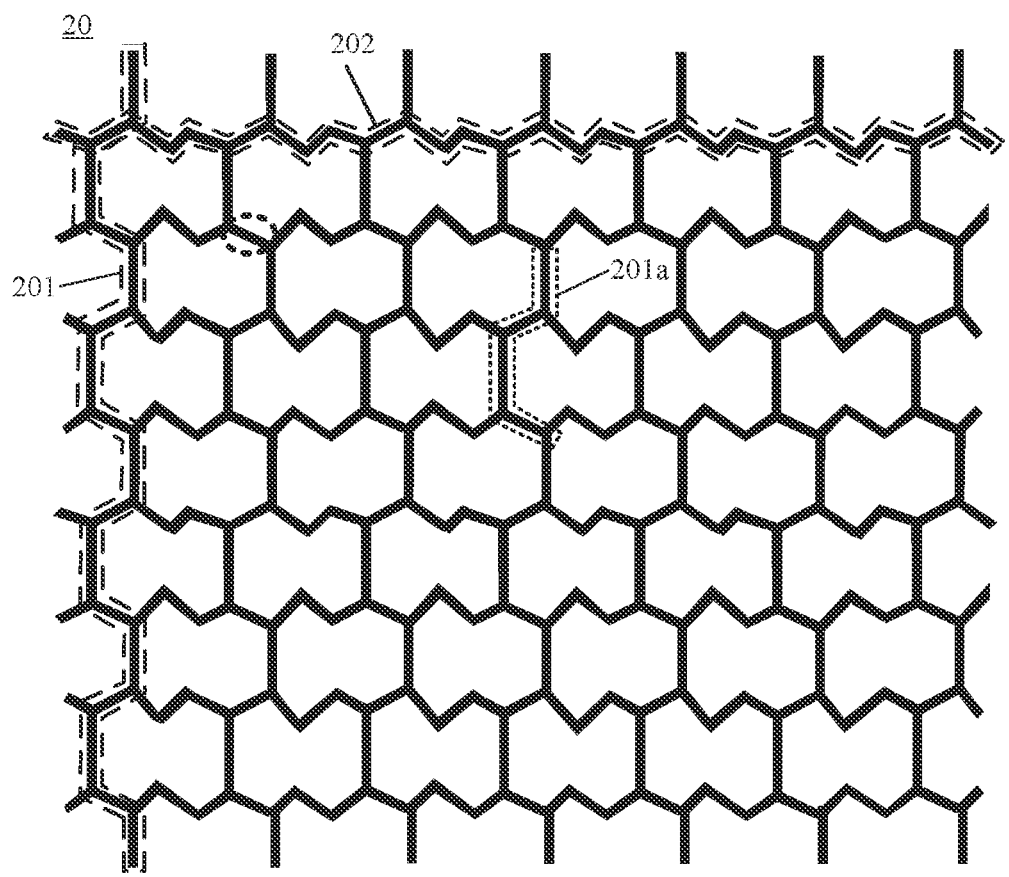
FIG. 5B is a structural diagram of a sensing electrode, in accordance with some other embodiments.

Referring to FIGS. 5A and 5B, the sensing electrode 20 includes a plurality of first conductive lines 201 that are substantially parallel to each other and a plurality of second conductive lines 202 that are substantially parallel to each other. The plurality of second conductive lines 202 and the plurality of first conductive lines 201 intersect, and the plurality of second conductive lines 202 electrically connect the plurality of first conductive lines 201 together.

It will be noted that, in a case where the touch panel 01 is applied to the touch display device 100, in order to prevent the touch lines 30 and the first conductive lines 201 and the second conductive lines 202 of the sensing electrodes 20 from affecting luminances of the sub-pixel regions 101a, in some embodiments, both the touch lines 30 and the sensing electrodes 20 are located in the pixel defining region 101b.

Here, it is possible that at least one first conductive line 201 and at least one second conductive line 202 are straight lines. In some embodiments, each first conductive line 201 and each second conductive line 202 are straight lines as shown in FIG. 5A. It is also possible that at least one first conductive line 201 and at least one second conductive line 202 are bending lines each including a plurality of bending points. In some embodiments, each first conductive line 201 and each second conductive line 202 are bending lines each including a plurality of bending points as shown in FIG. 5B. In the case where the touch panel 01 is applied to the touch display device 100 and the sensing electrodes 20 are located in the pixel defining region 101b, shapes of the first conductive line 201 and the second conductive line 202 may be set according to the shapes and an arrangement of the sub-pixel regions 101a. For example, the sub-pixel region 101a is in the hexagon shape as shown in FIG. 1, and the arrangement is as shown in FIG. 1, and in a case where the first conductive lines 201 and the second conductive lines 202 are located in the pixel defining region 101b, the first conductive line 201 and the second conductive line 202 need to be provided as bending lines each including a plurality of bending points.

In a case where both the first conductive line 201 and the second conductive line 202 are the bending lines each including the plurality of bending points, in some embodiments, section(s) of at least one first conductive line 201 are overlapped with section(s) of at least one second conductive line 202. In some examples, a partial section of each first conductive line 201 is overlapped with a partial section of respective second conductive line 202. The elliptical dashed circle in FIG. 5B indicates that a section of one first conductive line 201 is overlapped with a section of one second conductive line 202.

In addition, in a case where the first conductive line 201 is the bending line including the plurality of bending points, referring to FIG. 5B, the first conductive line 201 may be considered to consist of bending line groups 201a that are arranged periodically and connected end to end. For any two first conductive lines 201, if a connection line between a start point and an end point of a bending line group 201a in one first conductive line 201 is substantially parallel to a connection line between a start point and an end point of a bending line group 201a in another first conductive line 201, it is considered that the two first conductive lines 201 are substantially parallel to each other. It will be understood that, although the first conductive line 201 may be considered to consist of the bending line groups 201a that are arranged periodically and connected end to end, the first conductive line 201 is formed through a single patterning process when being actually manufactured, and thus two adjacent bending line groups 201a in the first conductive line 201 have no obvious boundary therebetween, and the entire first conductive line 201 is continuous. Similarly, in a case where the second conductive line 202 is the bending line including the plurality of bending points, it may be judged whether any two second conductive lines 202 are substantially parallel to each other according to the above method of judging whether any two first conductive lines 201 are substantially parallel to each other.

Figure 6A:
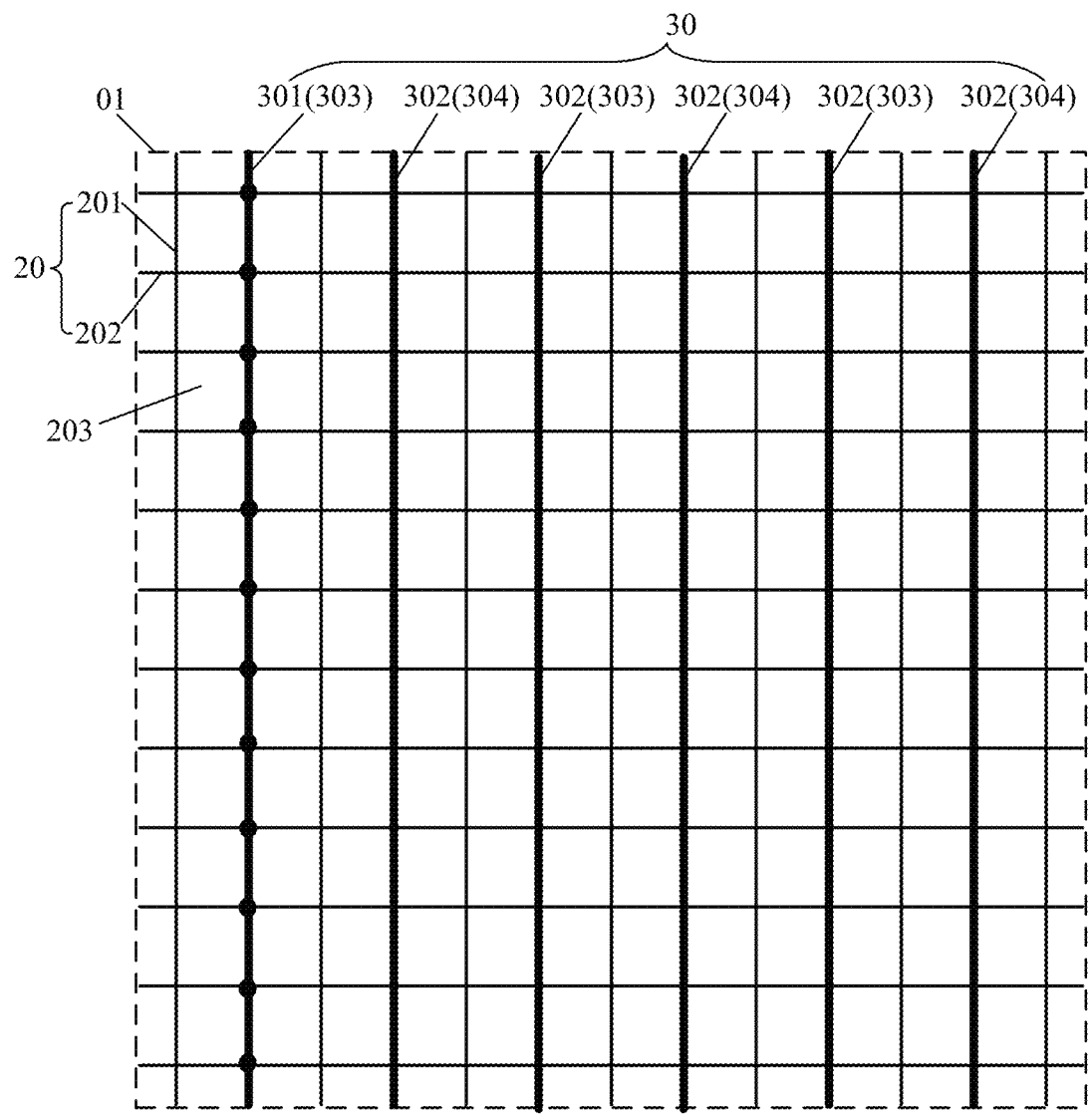
FIG. 6A is a structural diagram of a sensing electrode and touch lines, in accordance with some embodiments.
Figure 6B:
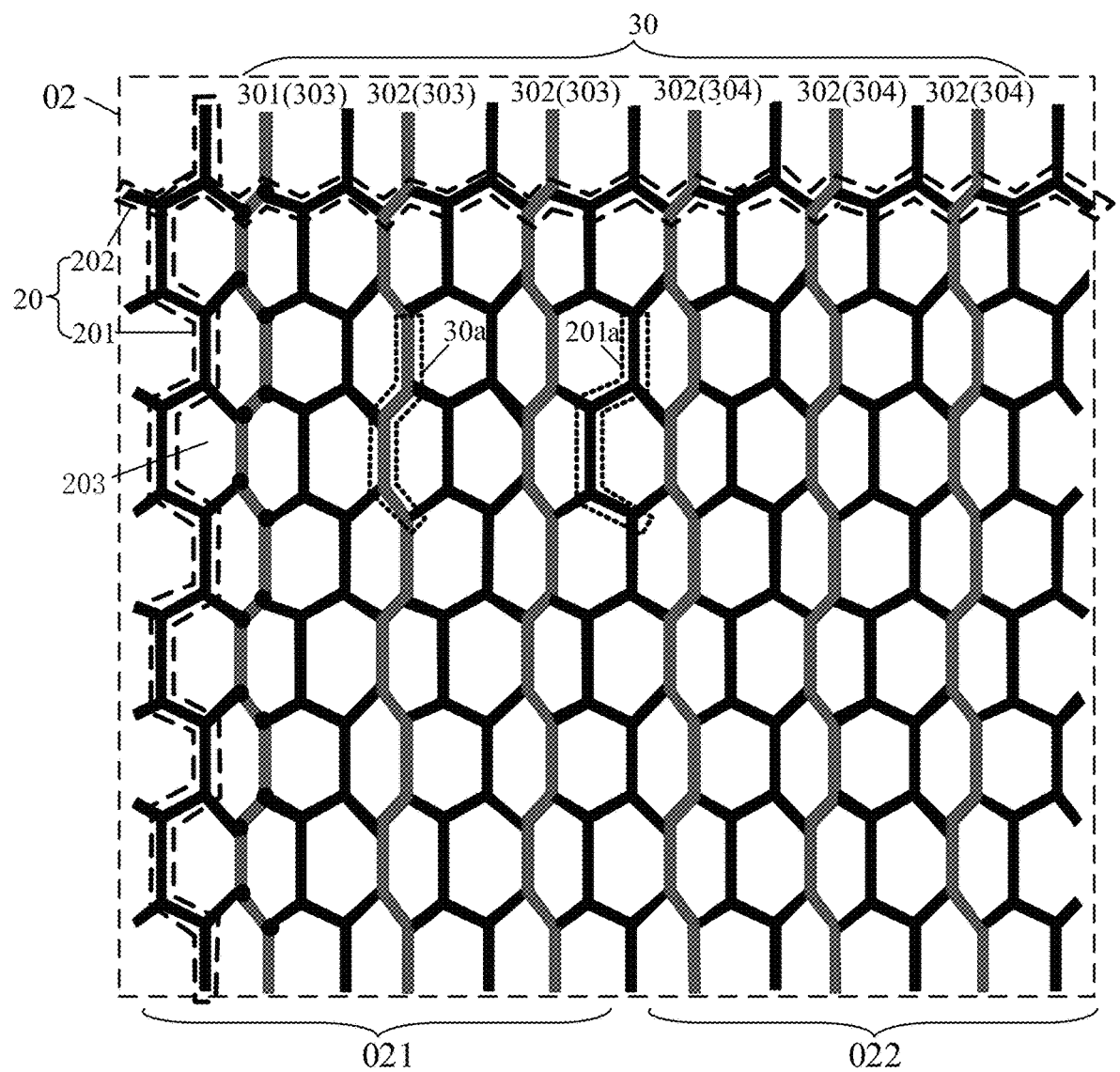
FIG. 6B is a structural diagram of a sensing electrode and touch lines, in accordance with some other embodiments.

As shown in FIGS. 6A and 6B, for each sensing electrode 20, at least two touch lines 30 cross the sensing electrode 20, and the at least two touch lines 30 are substantially parallel to the plurality of first conductive lines 201.

Here, it is possible that at least one touch line 30 is a straight line. In some embodiments, each touch line 30 is a straight line as shown in FIG. 6A. It is also possible that at least one touch line 30 is bending line(s) each including a plurality of bending points. In some embodiments, each touch line 30 is a bending line including a plurality of bending points as shown in FIG. 6B. In the case where the touch panel 01 is applied to the touch display device 100 and the touch lines 30 are located in the pixel defining region 101b, the shape of the touch line 30 may be set according to the shapes and the arrangement of the sub-pixel regions 101a. Examples are not described here, and for details, reference may be made to the first conductive line 201 and the second conductive line 202.

In a case where the touch line 30 is the bending line including the plurality of bending points, referring to FIG. 6B, the touch line 30 may be considered to consist of bending line groups 30a that are arranged periodically and connected end to end. It will be understood that, although the touch line 30 may be considered to consist of the bending line groups 30a that are arranged periodically and connected end to end, the touch line 30 is formed through a single patterning process when being actually manufactured, and thus two adjacent bending line groups 30a in the touch line 30 have no obvious boundary therebetween, and the entire touch line 30 is continuous. In addition, in the case where the touch line 30 is the bending line including the plurality of bending points, in some embodiments, as shown in FIG. 6B, the first conductive line 201 and the second conductive line 202 are also the bending lines each including the plurality of bending points. In this case, for any one touch line 30 and one first conductive line 201, if a connection line between a start point and an end point of a bending line group 30a in the touch line 30 is substantially parallel to the connection line between the start point and the end point of the bending line group 201a in the first conductive line 201, it is considered that the touch line 30 and the first conductive line 201 are substantially parallel to each other. In a case where the touch line 30 is the bending line including the plurality of bending points and the first conductive line 201 is the straight line, if the connection line between the start point and the end point of the bending line group 30a in the touch line 30 is parallel to the first conductive line 201, it is considered that the touch line 30 and the first conductive line 201 are substantially parallel to each other. In a case where the touch line 30 is a straight line and the first conductive line 201 is the bending line including the plurality of bending points, if the touch line 30 is substantially parallel to the connection line between the start point and the end point of the bending line group 201a in the first conductive line 201, it is considered that the touch line 30 and the first conductive line 201 are substantially parallel to each other.

In addition, in a case where the touch line 30 is the bending line including the plurality of bending points and the first conductive line 201 and the second conductive line 202 are also the bending lines each including the plurality of bending points, referring to FIG. 6B, orthographic projection(s) of section(s) of at least one touch line 30 on the base 10 are overlapped with orthographic projection(s) of section(s) of at least one second conductive line 202 on the base 10. In some embodiments, the orthographic projection(s) of the section(s) of each touch line 30 on the base 10 are overlapped with the orthographic projection(s) of the section(s) of the at least one second conductive line 202 on the base 10.

Referring to FIGS. 6A and 6B, the at least two touch lines 30 crossing the sensing electrode 20 include first touch line(s) 301 electrically connected to the sensing electrode 20 and second touch line(s) 302 not electrically connected to the sensing electrode 20. Orthographic projection(s) of the second touch line(s) 302 on the base 10 and orthographic projections of the plurality of first conductive lines 201 in the sensing electrode 20 on the base 10 have no overlapping region.

It will be noted that, orthographic projection(s) of the first touch line(s) 301 on the base 10 and the orthographic projections of the plurality of first conductive lines 201 in the sensing electrode 20 on the base 10 may have overlapping region(s), or may have no overlapping region.

Referring to FIG. 4, one touch line 30 may cross a plurality of sensing electrodes 20. For a sensing electrode 20 electrically connected to the touch line 30, the touch line 30 is the first touch line 301, and for a sensing electrode 20 that is not electrically connected to the touch line 30, the touch line 30 is the second touch line 302. Based on this, in the embodiments of the present disclosure, according to connection relationships between each sensing electrode 20 and the at least two touch lines 30 crossing the sensing electrode 20, it is determined whether the at least two touch lines 30 crossing the sensing electrode 20 are each the first touch line 301 or the second touch line 302. If a touch line 30 is electrically connected to the sensing electrode 20, for the sensing electrode 20, the touch line 30 is the first touch line 301. If a touch line 30 is not electrically connected to the sensing electrode 20, for the sensing electrode 20, the touch line 30 is the second touch line 301.

In addition, it is possible that one sensing electrode 20 is electrically connected to one first touch line 301. In a case where the number of sensing electrodes 20 in the touch panel 01 in an extending direction of the first conductive lines 201 is small, it is also possible that one sensing electrode 20 is electrically connected to two or more first touch lines 301.

On this basis, referring to FIGS. 6A and 6B, orthographic projections of the sensing electrodes 20 in the touch panel 01 on the base 10 and orthographic projections of the touch lines 30 crossing the sensing electrodes 20 on the base 10 form a plurality of squares 203. In the case where the touch panel 01 is applied to the touch display device 100, one sub-pixel region 101a corresponds to one square 203.

The embodiments of the present disclosure provide the touch panel 01, and the touch panel 01 includes the base 10 and the sensing electrodes 20 disposed on the base 10. The sensing electrode 20 includes the plurality of first conductive lines 201 that are substantially parallel to each other and the plurality of second conductive lines 202 that are substantially parallel to each other. The plurality of second conductive lines 202 and the plurality of first conductive lines 201 intersect, and the plurality of second conductive lines 202 electrically connect the plurality of first conductive lines 201 together. The touch panel 01 further includes the at least two touch lines 30 disposed on the base 10 and crossing the sensing electrode 20. The at least two touch lines 30 are substantially parallel to the plurality of first conductive lines 201. The at least two touch lines 30 include the first touch line(s) 301 electrically connected to the sensing electrode 20 and the second touch line(s) 302 not electrically connected to the sensing electrode 20. The orthographic projection(s) of the second touch line(s) 302 on the base 10 and the orthographic projections of the plurality of first conductive lines 201 in the sensing electrode 20 on the base 10 have no overlapping region. In the related art, since an orthographic projection of a first conductive line on a base and an orthographic projection of a second touch line on the base have an overlapping region, a coupling capacitance, i.e., a parasitic capacitance, is generated between the first conductive line and the second touch line. However, in the embodiments of the present disclosure, since the orthographic projection(s) of the second touch line(s) 302 on the base 10 and the orthographic projections of the plurality of first conductive lines 201 in the sensing electrode 20 on the base 10 have no overlapping region, a coupling capacitance may be prevented from generating between the second touch line 302 and the first conductive line 201, so that a capacitive load of the sensing electrode 20 may be effectively reduced, which is beneficial to improve a touch report rate and a signal-to-noise ratio.

It will be understood that, since the first touch line 301 is electrically connected to the sensing electrode 20, even if the orthographic projection of the first touch line 301 on the base 10 and the orthographic projections of the plurality of first conductive lines 201 in the sensing electrode 20 on the base 10 have overlapping region(s), the first touch line 301 and the first conductive line 201 have no coupling capacitance therebetween.

Figure 7A:
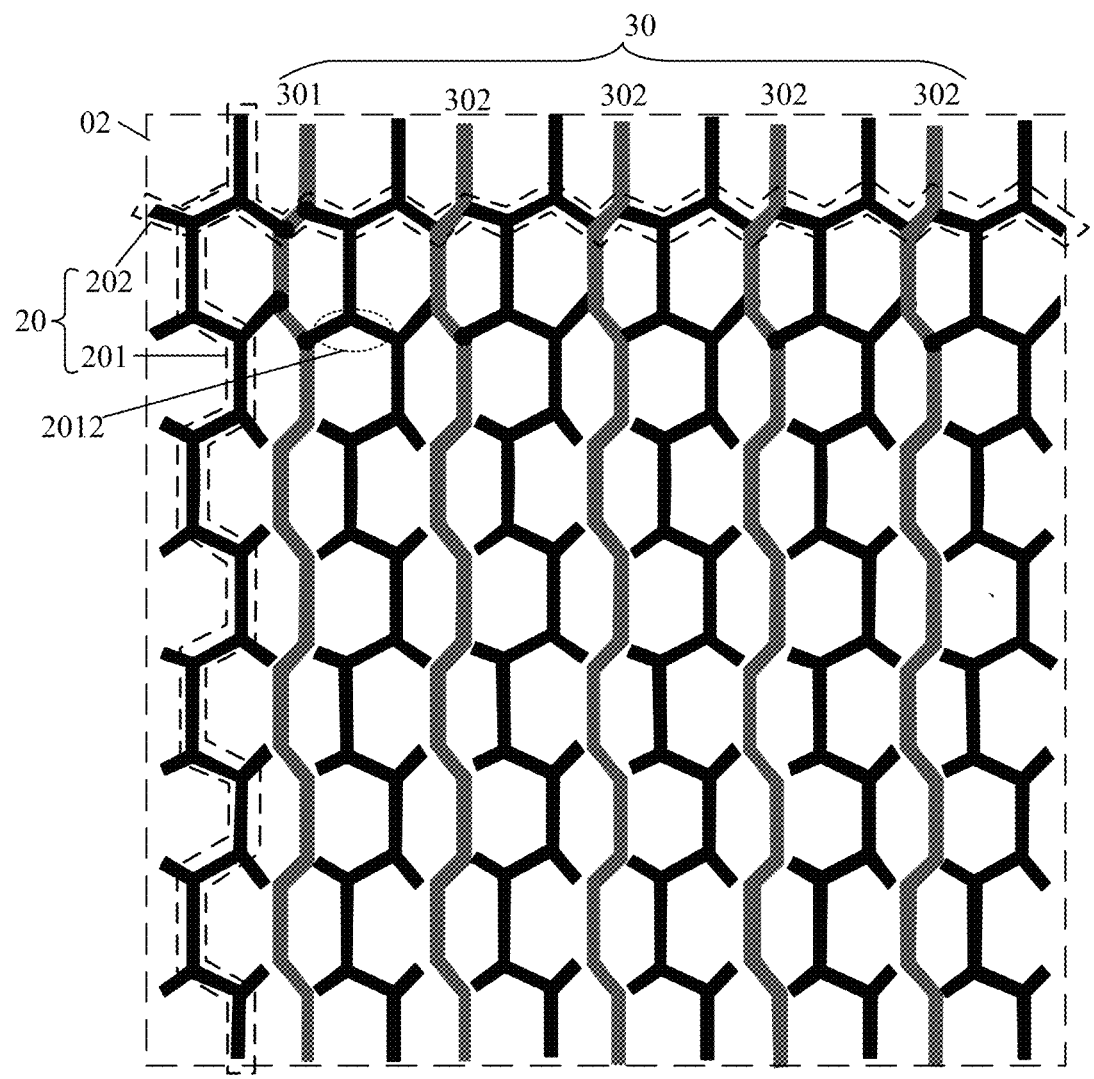
FIG. 7A is a structural diagram of a sensing electrode and touch lines, in accordance with yet other embodiments.
Figure 7B:
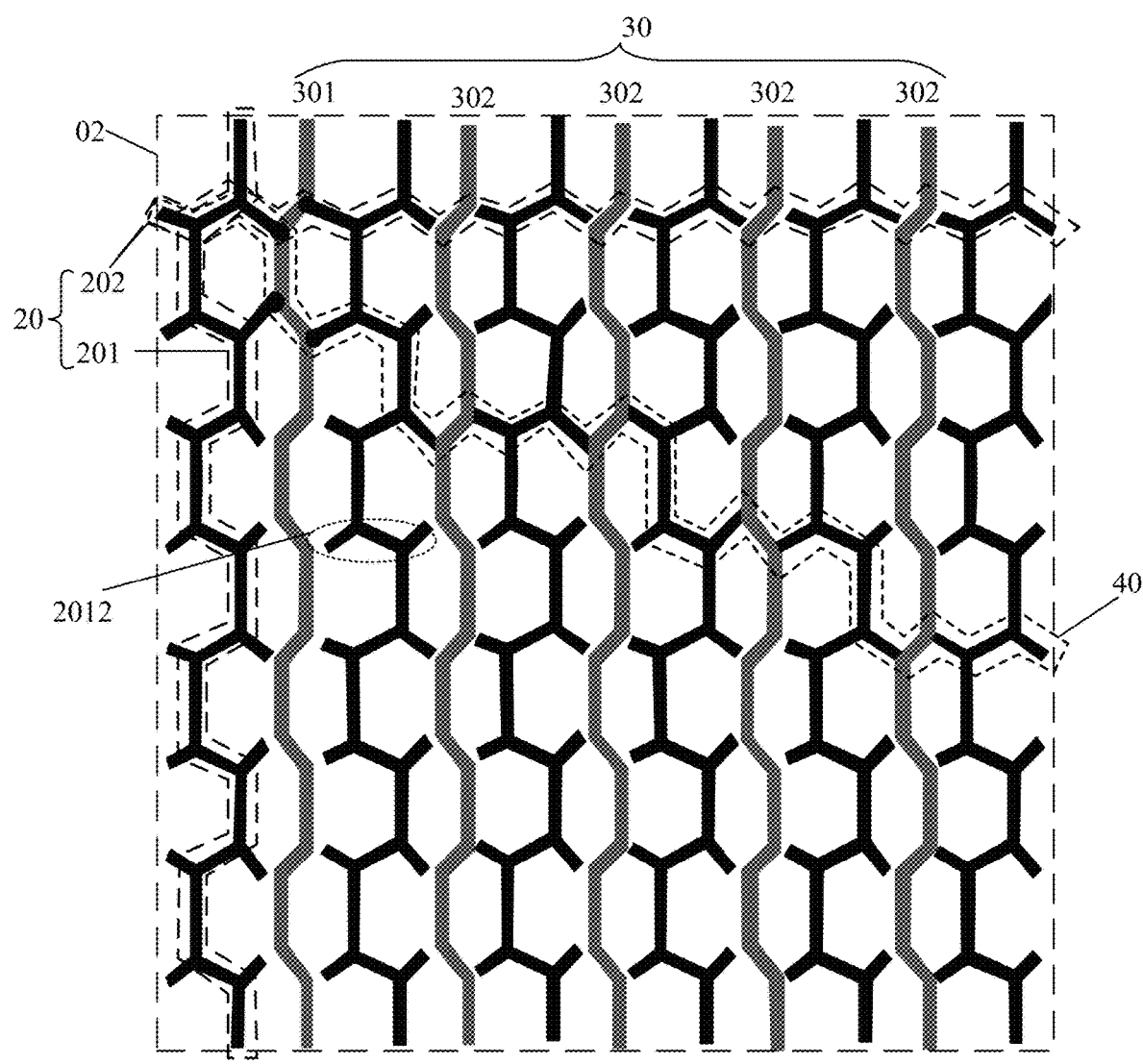
FIG. 7B is a structural diagram of a sensing electrode and touch lines, in accordance with yet other embodiments.

Considering that a coupling capacitance is also generated at a position where the second touch line 302 and the second conductive line 202 cross, on this basis, in some embodiments, as shown in FIGS. 7A and 7B, at least one of the plurality of second conductive lines 202 in the sensing electrode 20 includes a plurality of conductive sections 2012 that are disconnected from one another, and at least one conductive section 2012 is connected to at least one first conductive line 201. There is no overlapping region between the orthographic projection of the second touch line 302 on the base 10 and orthographic projections of conductive sections of the plurality of conductive sections in addition to conductive sections for connecting the plurality of first conductive lines 201 together on the base 10.

It will be noted that, for the second conductive line 202 including the plurality of conductive sections that are disconnected from one another, the plurality of conductive sections in the second conductive line 202 may all be connected to the first conductive lines 201, or some of the conductive sections are connected to the first conductive lines 201, and some of the conductive sections are not connected to the first conductive lines 201. The conductive sections that are not connected to the first conductive lines 201 are virtual conductive sections (also referred to as dummy conductive sections).

Here, since the plurality of second conductive lines 202 electrically connect the plurality of first conductive lines 201 together, as shown in FIG. 7A, it is possible that at least one second conductive line 202 is communicated. In this case, there is no overlapping region between the orthographic projection of the second touch line 302 on the base 10 and orthographic projection(s) of second conductive line(s) 202 in addition to second conductive line(s) 202 for electrically connecting the plurality of first conductive lines 201 together on the base 10. In FIG. 7A, in a direction from top to bottom, a first second conductive line 202 and a second second conductive line 202 are both communicated. In addition, the communicated second conductive lines 202 may be located at an upper side and/or a lower side of the sensing electrode 20, or located at other positions. FIG. 7A illustrates an example in which the communicated second conductive lines 202 are located at the upper side of the sensing electrode 20. Of course, as shown in FIG. 7B, it is also possible that each of the plurality of second conductive lines 202 in the sensing electrode 20 includes the plurality of conductive sections that are disconnected from one another. Conductive sections in different second conductive lines 202 are connected through the first conductive lines 201, so as to form at least one path 40 (the dashed block in FIG. 7B indicates one path). The path 40 may electrically connect the plurality of first conductive lines 201 together.

In addition, under a premise of ensuring that the plurality of second conductive lines 202 electrically connect the plurality of first conductive lines 201 together, the number of continuous second conductive lines 202 may be appropriately increased according to the load of the sensing electrode 20 and a demand for a sensing amount, or, the number of paths 40 formed by connecting the conductive sections in different second conductive lines 202 through the first conductive lines 201 may be increased. The greater the number of connected second conductive lines 202 or the paths 40, the greater an overlapping area between the sensing electrode 20 and the first touch lines 301, and the sensing amount during touch increases. In a case where the touch panel 01 is in use, if the thickness of the touch panel 01 is large, the sensing amount is low. In this case, a line width of the touch line 30, and the number of continuous second conductive lines 202 or the paths 40 may be appropriately increased to increase a sensing area, so as to increase the sensing amount.

In addition, when the second conductive line 202 is cut to make the second conductive line 202 include the plurality of conductive sections that are disconnected from one another, the smaller a distance between an end point of a conductive section in the second conductive line 202 and the second touch line 302, the larger the sensing area reserved in the sensing electrode 20, which is beneficial to improve the sensing amount. Based on this, in a case where the second conductive line 202 is cut to prevent the orthographic projections of the second conductive line 202 and the second touch line 302 on the base 10 from overlapping, and a process allowable error (overlay) is considered, the second conductive line 202 should be retained as much as possible.

In the embodiments of the present disclosure, since the second conductive line 202 is cut and hollowed out, the at least one of the plurality of second conductive lines 202 in the sensing electrode 20 includes the plurality of conductive sections that are disconnected from one another, and the at least one conductive section is connected to the at least one first conductive line 201. There is no overlapping region between the orthographic projection of the second touch line 302 on the base 10 and the orthographic projections of the conductive sections of the plurality of conductive sections in addition to the conductive sections for connecting the plurality of first conductive lines together on the base 10. Therefore, the coupling capacitance between the sensing electrode 20 and the second touch line(s) 302 may be further reduced, thereby reducing the capacitive load.

Figure 8:
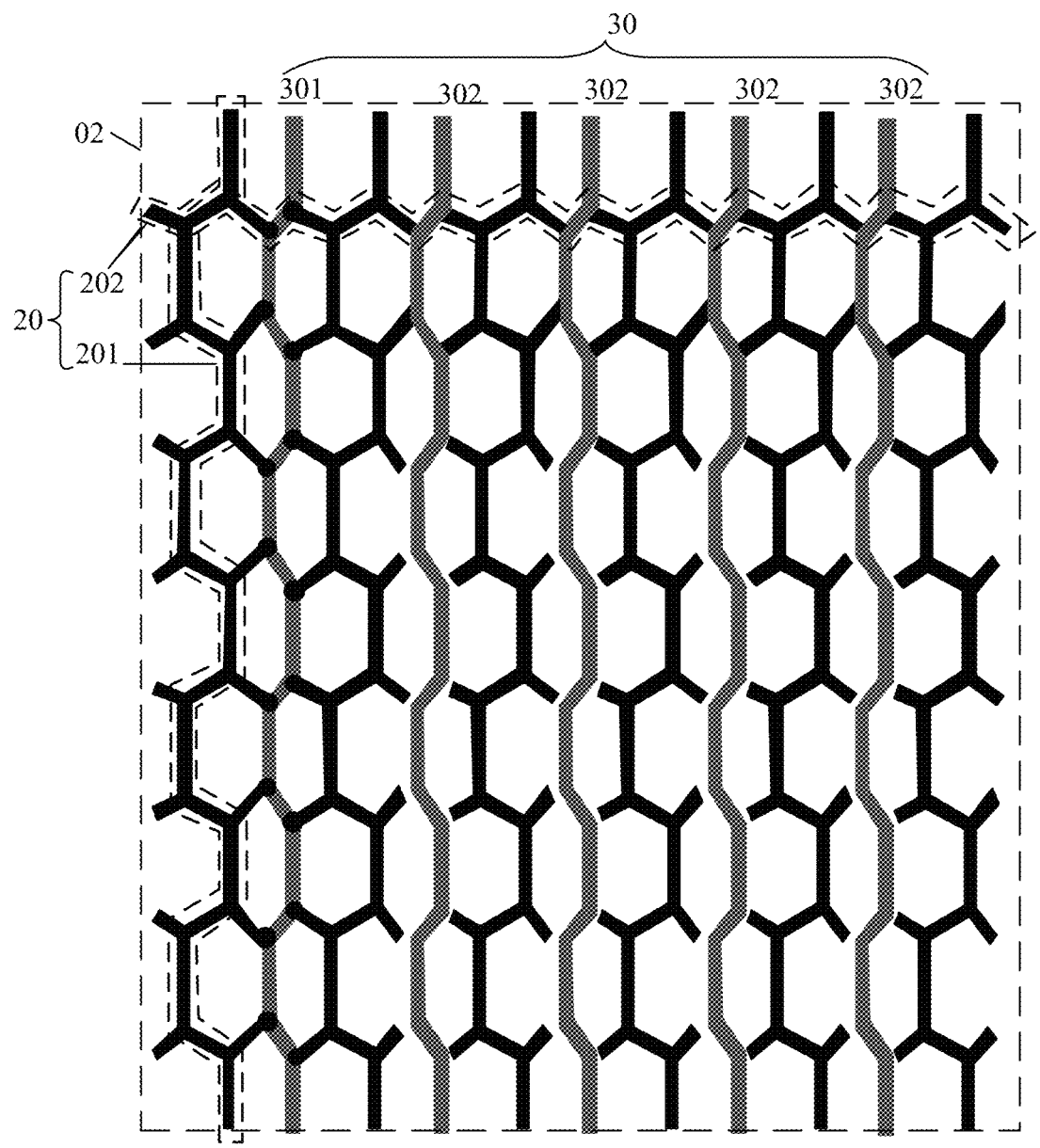
FIG. 8 is a structural diagram of a sensing electrode and touch lines, in accordance with yet other embodiments.

In some embodiments, the first touch line 301 is connected to at least two of the plurality of second conductive lines 202 in the sensing electrode 20, and positions of the at least two of the plurality of second conductive lines 202 connected with the first touch line 301 are communicated. In some examples, as shown in FIG. 8, it is possible that the first touch line 301 is connected to each second conductive line 202 in the sensing electrode 20, and positions of each second conductive line 202 connected with the first touch line 301 are communicated.

It will be understood that, since the first touch line 301 is electrically connected to the sensing electrode 20, even if there is an overlapping region between the orthographic projection of the first touch line 301 on the base 10 and the orthographic projection of the second conductive line 202 on the base 10, no coupling capacitance is generated.

In the embodiments of the present disclosure, since the first touch line 301 is connected to the at least two of the plurality of second conductive lines 202 in the sensing electrode 20, it may be ensured that the first touch line 301 and the sensing electrode 20 have better conduction performance, which improves the connection reliability. In addition, in a case where the first touch line 301 is connected to the second conductive line 202 through a via hole in an insulating layer, if the first touch line 301 is connected to the at least two of the plurality of second conductive lines 202 in the sensing electrode 20, the number of via holes is increased. Since a resistance at the via hole is large, an impact on an overall resistance of the sensing electrode 20 will be reduced when a via hole process results in fluctuation of an overlap resistance, which ensures a better conduction performance between the first touch line 301 and the sensing electrode 20 at the via holes and process stability.

In some embodiments, the sensing electrode 20 includes a first region. The touch lines 30 crossing the sensing electrode 20 and a plurality of first conductive lines 201 located in the first region are arranged alternately.

Figure 9A:
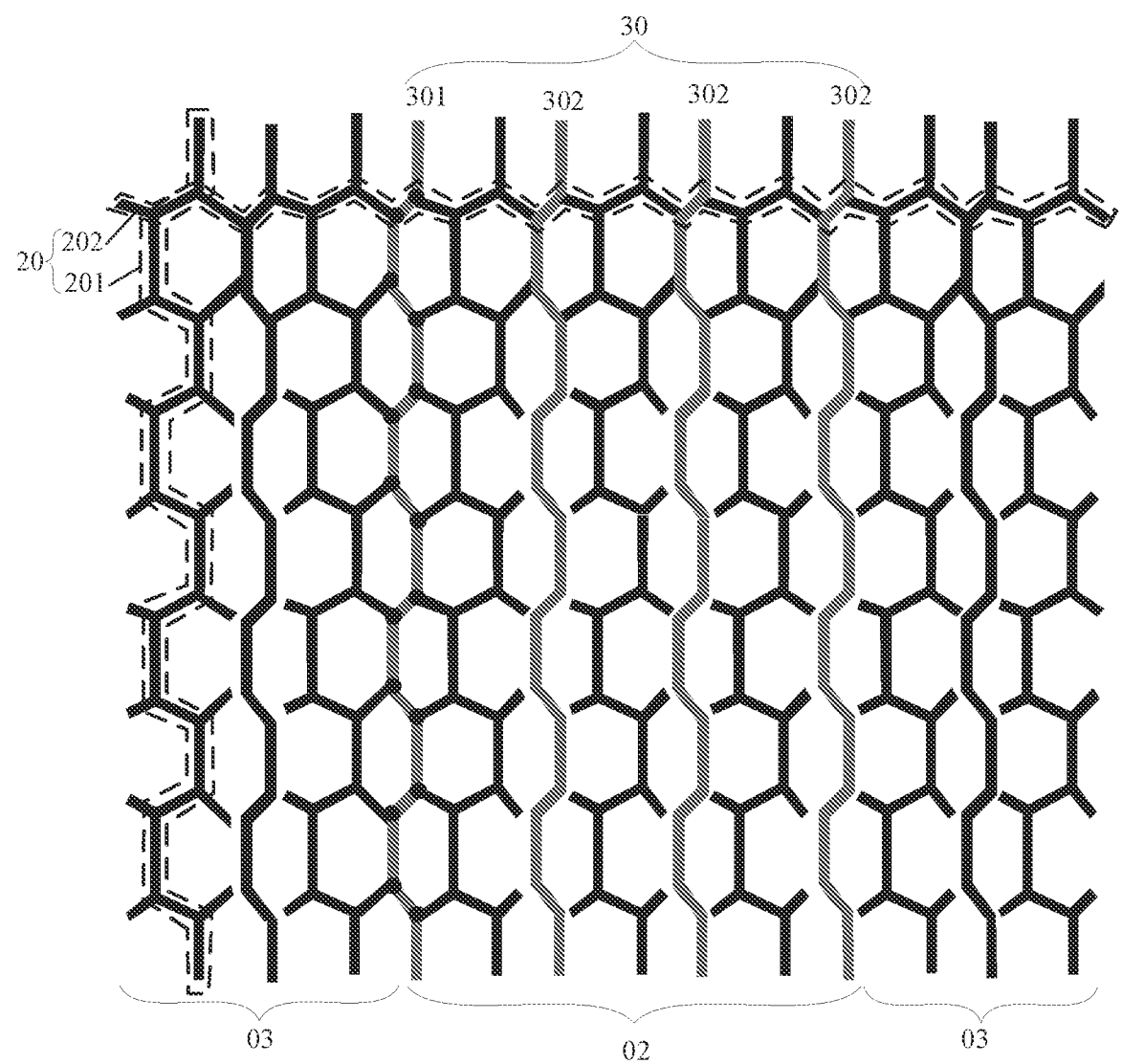
FIG. 9A is a structural diagram of a sensing electrode and touch lines, in accordance with yet other embodiments.
Figure 9B:
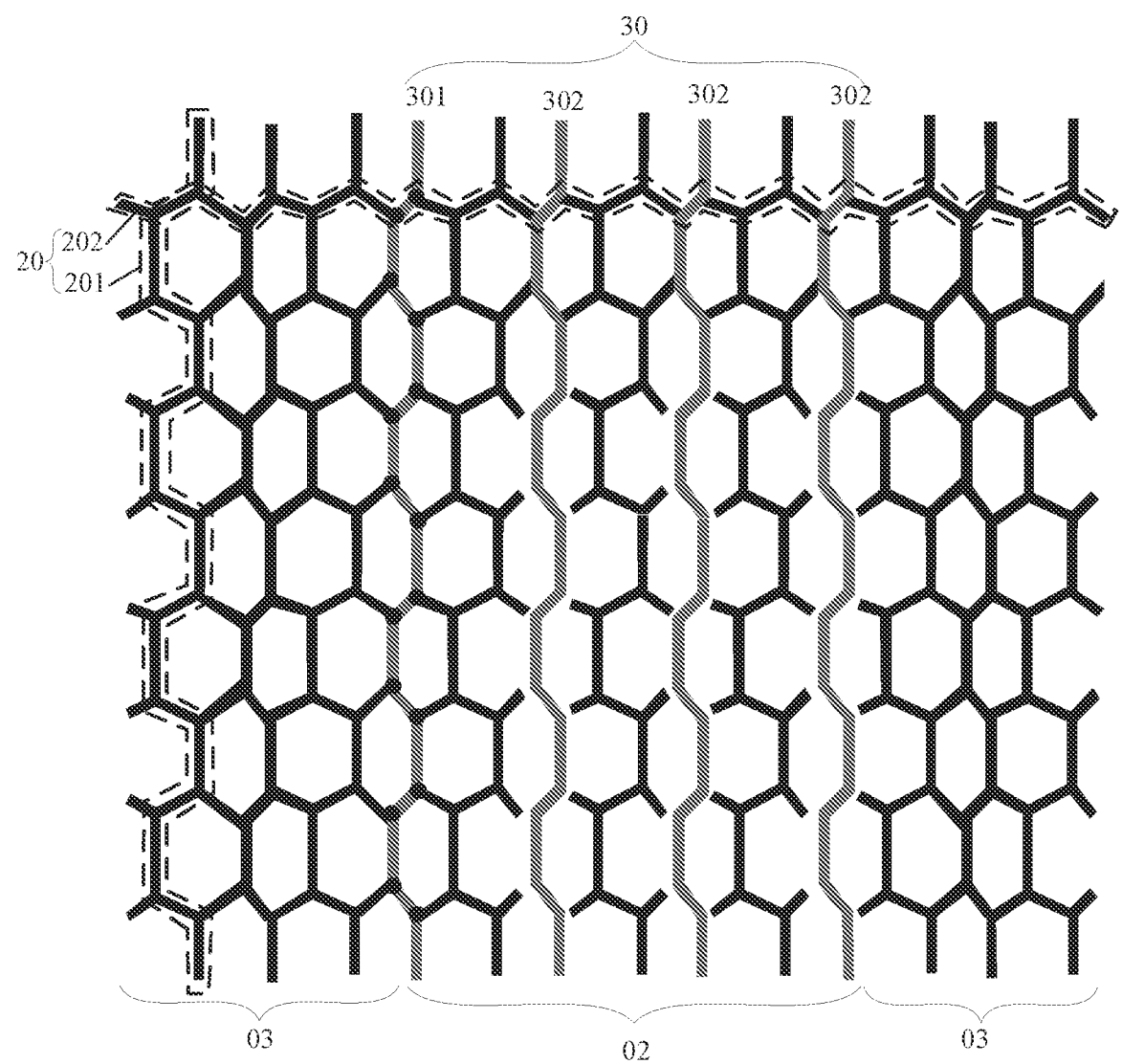
FIG. 9B is a structural diagram of a sensing electrode and touch lines, in accordance with yet other embodiments.

Here, as shown in FIGS. 6A, 6B, 7A, 7B and 8, it is possible that the first region 02 is a region occupied by the sensing electrode 20. That is, the touch lines 30 crossing the sensing electrode 20 are distributed on the entire sensing electrode 20. As shown in FIGS. 9A and 9B, it is also possible that the first region 02 is a part of the region occupied by the sensing electrode 20. In this case, the sensing electrode 20 further includes a second region 03 located at at least one side of the first region 02 in an extending direction of the second conductive lines 202. First conductive lines 201 located in the second region 03 are arranged continuously. That is, the touch lines 30 are arranged in the first region 02 and are not arranged in the second region 03. In a case where the number of touch lines 30 crossing the sensing electrode 20 is small, the touch lines 30 may be arranged only in the first region 02 of the sensing electrode 20.

Based on the above, in some examples, the sensing electrode 20 includes the first region 02 and the second region 03 located at a side of the first region 02 in the extending direction of the second conductive lines 202. In some other examples, as shown in FIGS. 9A and 9B, the sensing electrode 20 includes the first region 02 and two second regions 03, and the two second regions 03 are located at two opposite sides of the first region 02 in the extending direction of the second conductive lines 202.

Figure 10A:
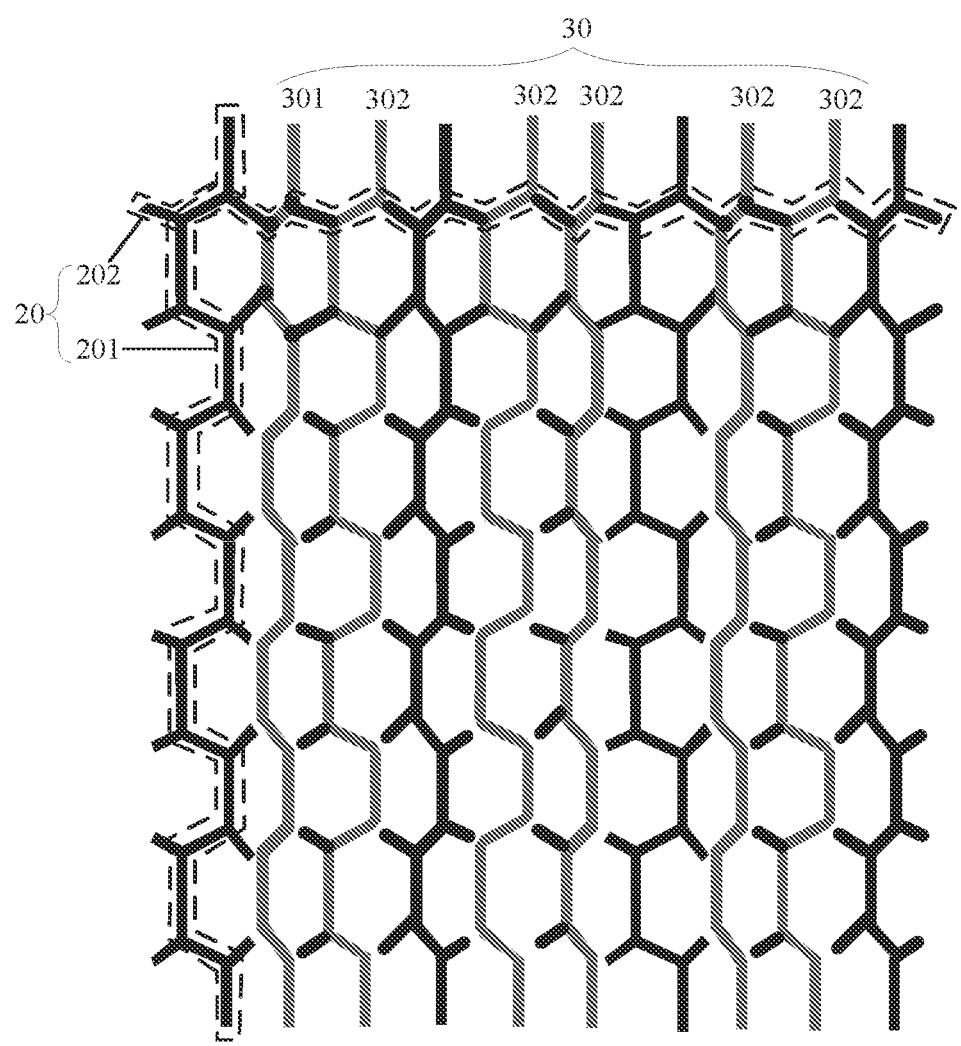
FIG. 10A is a structural diagram of a sensing electrode and touch lines, in accordance with yet other embodiments.
Figure 10B:
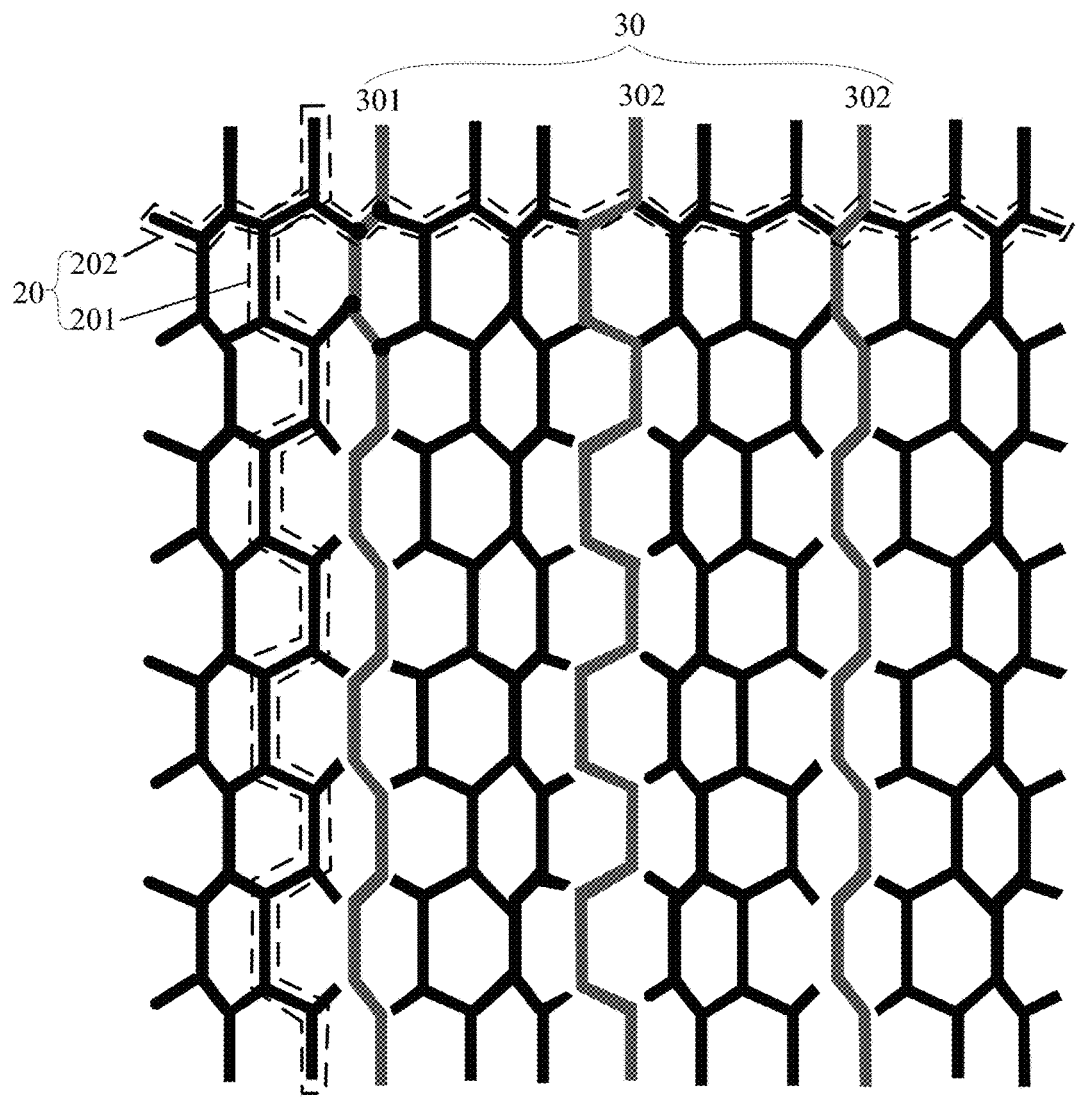
FIG. 10B is a structural diagram of a sensing electrode and touch lines, in accordance with yet other embodiments.

In addition, at least two touch lines 30 and the plurality of first conductive lines 201 located in the first region 02 are arranged alternately. As shown in FIGS. 6A, 6B, 7A, 7B, 8, 9A and 9B, it is possible that one first conductive line 201 and one touch line 30 located in the first region 02 are arranged alternately. As shown in FIG. 10A, it is also possible that at least two touch lines 30 are provided between two adjacent first conductive lines 201 (FIG. 10A illustrates an example in which two touch lines 30 are provided between every two adjacent first conductive lines 201). In this case, the number of touch lines 30 provided between every two adjacent first conductive lines 201 may be same or different. As shown in FIG. 10B, it is also possible that at least two first conductive lines 201 are provided between two adjacent touch lines 30 (FIG. 10B illustrates an example in which two first conductive lines 201 are provided between two every adjacent touch lines 30). In this case, the number of first conductive lines 201 provided between every two adjacent touch lines 30 may be same or different. Of course, it is also possible that x first conductive lines 201 and y touch lines 30 are arranged at intervals, here, x is greater than or equal to 2 (x≥2), y is greater than or equal to 2 (y≥2), x and y are positive integers, and x and y may be same or different. It will be understood that, arrangements of the touch lines 30 crossing the sensing electrode 20 and the plurality of first conductive lines 201 located in the first region 02 include, but are not limited to, the arrangements listed above, and may also be other arrangements, which will not be listed here.

Based on the above, if the sensing electrode 20 includes the first region 02 and the second region 03 located at at least one side of the first region 02 in the extending direction of the second conductive lines 202, in a case where at least one of the plurality of second conductive lines 202 in the sensing electrode 20 includes the plurality of conductive sections that are disconnected from one another, as shown in FIG. 9B, portions the plurality of second conductive lines 202 located in the second region 03 are communicated, and a portion of the at least one of the plurality of second conductive lines 202 in the sensing electrode 20 located in the first region 02 includes the plurality of conductive sections that are disconnected from one another.

Since the touch line 30 is located in the first region 02 of the sensing electrode 20, there is no overlapping region between the orthographic projection of the touch line 30 and orthographic projections of the portions of the second conductive lines 202 located in the second region on the base 10. Therefore, no coupling capacitance is generated between the touch line 30 and the portions of the second conductive lines 202 located in the second region. The portions of the plurality of second conductive lines 202 located in the second region 03 are communicated, which may increase the sensing area of the sensing electrode 20 and increase the sensing amount.

In a case where the first region 02 is the region occupied by the sensing electrode 20, in some embodiments, as shown in FIGS. 6A and 6B, the at least two touch lines 30 (i.e., the touch lines 30 crossing the sensing electrode 20) include a plurality of effective touch lines 303 used for transmitting sensing signals and a plurality of dummy touch lines 304 not used for transmitting sensing signals.

In the embodiments of the present disclosure, in a case where the number of sensing electrodes 20 provided in the extending direction of the second conductive lines 202 in the touch panel 01 is small, the number of effective touch lines that are required to be electrically connected to the sensing electrode 20 and used for transmitting the sensing signals is small. In order to make the touch lines 30 evenly distributed in the region occupied by the sensing electrodes 20 to reduce a visualized risk of the touch lines 30 and the sensing electrodes 20, the dummy touch lines may be provided.

It will be noted that, since the effective touch lines are used for transmitting the sensing signals, the effective touch lines must be electrically connected to the sensing electrodes 20. For an effective touch line crossing any sensing electrode 20, the effective touch line may be electrically connected to the sensing electrode 20, or may be electrically connected to other sensing electrode 20 without being electrically connected to the sensing electrode 20. Since the dummy touch lines are not used for transmitting the sensing signals, in some examples, the dummy touch lines are not connected to any sensing electrode 20. In some other examples, the dummy touch line includes a plurality of dummy sensing sub-electrode lines that are disconnected from one another. An orthographic projection of each dummy sensing sub-electrode line on the base 10 and an orthographic projection of one sensing electrode 20 on the base 10 have an overlapping region therebetween, and each dummy sensing sub-electrode line is electrically connected to the second conductive line 202 in the sensing electrode 20. In this case, the dummy sensing sub-electrode lines correspond to a part of the sensing electrode 20. The dummy sensing sub-electrode line is electrically connected to the second conductive line 202, which may increase the sensing area of the sensing electrode 20 and increase the sensing amount during touch.

In addition, in some embodiments, as shown in FIG. 6A, the plurality of dummy touch lines 304 are evenly distributed in the first region 02 of the sensing electrode 20. That is, the plurality of dummy touch lines 304 are distributed on the entire sensing electrode 20. In some other embodiments, as shown in FIG. 6B, the first region 02 includes a first sub-region 021 and a second sub-region 022 located at at least one side of the first sub-region 021 in the extending direction of the second conductive lines 202. The plurality of effective touch lines 303 are located in the first sub-region 021, and the plurality of dummy touch lines 304 are located in the second sub-region 022.

It is possible that the first region 02 includes the first sub-region and the second sub-region located at a side of the first sub-region in the extending direction of the second conductive lines 202. It is also possible that the first region 02 includes the first sub-region and two second sub-regions, and the two second sub-regions are located at two opposite sides of the first sub-region in the extending direction of the second conductive lines 202.

Based on the above, in the case where the touch panel 01 is applied to the touch display device, one touch line 30 may be provided in a gap between two adjacent sub-pixel regions 101a, i.e., in the pixel defining region 101b between the two adjacent sub-pixel regions 101a. In a case where the number of touch lines 30 is large, a plurality of touch lines 30 may also be provided in the gap between the two adjacent sub-pixel regions 101a. In order to avoid the visualized risk of the touch lines 30 and the first conductive lines 201 and the second conductive lines 202 in the sensing electrodes 20, all of the first conductive lines 201 in the sensing electrode 20 and all of the touch lines 30 crossing the sensing electrode 20 should be distributed as evenly as possible.

In some embodiments, the plurality of first conductive lines 201 in the sensing electrode 20 and all of the touch lines 30 crossing the sensing electrode 20 form a plurality of line groups. Two adjacent line groups have m sub-pixel regions 101a therebetween, m is greater than or equal to 1 (m≥1), and m is a positive integer. The line group includes at least one first conductive line 201 and/or at least one touch line 30.

Here, the number of sub-pixel regions 101a between every two adjacent line groups is same.

In addition, the line group may include at least one first conductive line 201 or at least one touch line 30. It is also possible that the line group includes at least one first conductive line 201 and at least one touch line 30. On this basis, in order to reduce the visualized risk, the number of the lines included in each line group is same.

For example, each line group includes P first conductive lines 201 and Q touch lines 30, here, P is greater than or equal to 1 (P≥1), Q is greater than or equal to 1 (Q≥1), and P and Q are positive integers. For another example, the plurality of line groups includes P first line group and P second line group. The first line group includes P first conductive lines 201, and the second line group includes P touch lines 30.

Figure 11A:
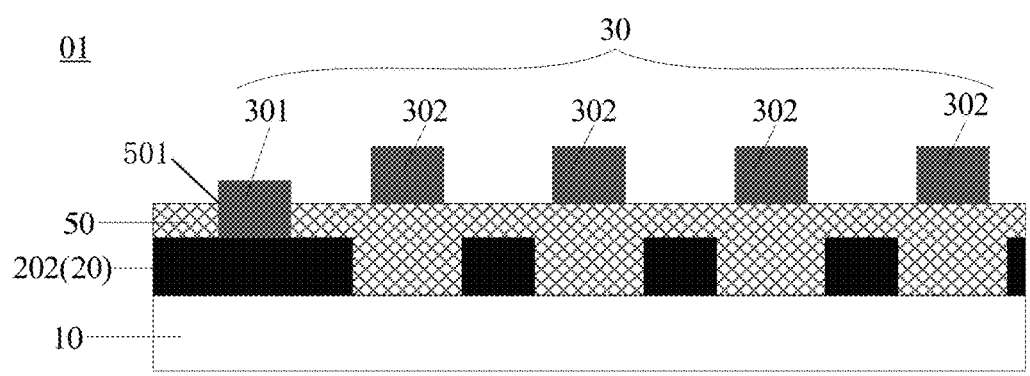
FIG. 11A is a structural diagram of a touch panel, in accordance with some other embodiments.

In some embodiments, as shown in FIG. 11A, the touch lines 30 and the sensing electrodes 20 are arranged in different layers. The touch panel 01 further includes the insulating layer 50 disposed between the sensing electrodes 20 and the at least two touch lines 30. The first touch line 301 is connected to the sensing electrode 20 through the via hole(s) 501 in the insulating layer 50.

Here, it is possible that the sensing electrodes 20 are proximate to the base 10 relative to the touch lines 30. It is also possible that the touch lines 30 are proximate to the base 10 relative to the sensing electrodes 20.

In addition, the insulating layer 50 may be, for example, made of at least one of silicon nitride, silicon oxide, or silicon oxynitride.

In the embodiments of the present disclosure, the touch lines 30 and the sensing electrodes 20 are arranged in different layers, so as to avoid electrical connections between the sensing electrodes 20 and the second touch lines 302 when the touch panel 01 is manufactured.

Figure 11B:
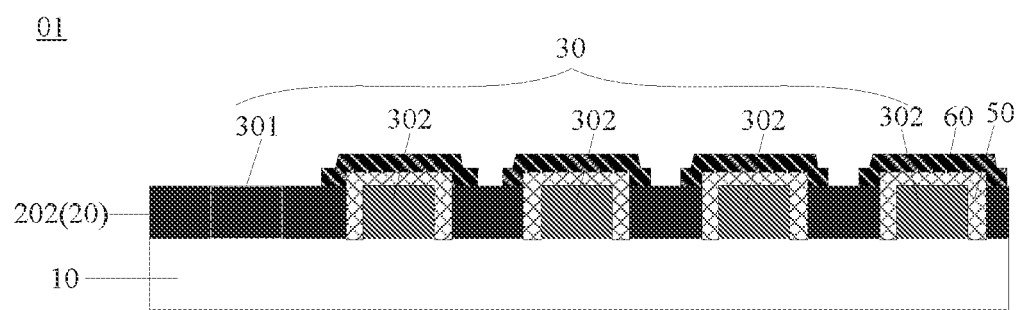
FIG. 11B is a structural diagram of a touch panel, in accordance with yet other embodiments.

In some other embodiments, as shown in FIG. 11B, at least two touch lines 30 and the sensing electrodes 20 are arranged in a same layer. In a case where positions of the second conductive line 202 intersected with the second touch 302 line are communicated, the second touch line 302 is connected through a bridge 60 at the intersection positions, and an insulating layer 50 is provided between the bridge 60 and the second conductive line 202. Or, the second conductive line 202 is connected through a bridge 60 at the intersection positions, and an insulating layer 50 is provided between the bridge 60 and the second touch line 302.

Here, it is possible that the touch line 30 and the sensing electrode 20 are proximate to the base 10 relative to the bridge 60. It is also possible that the bridge 60 is proximate to the base 10 relative to the touch line 30 and the sensing electrode 20.

In the embodiments of the present disclosure, by arranging the touch lines 30 and the sensing electrodes 20 in the same layer, the visualized risk caused by a height difference due to the sensing electrode 20 and the touch line 30 located in different layers may be reduced.

The foregoing descriptions are merely specific implementations of the present disclosure, but the protection scope of the present disclosure is not limited thereto. Changes or replacements that any person skilled in the art could conceive of within the technical scope of the present disclosure should be included in the protection scope of the present disclosure. Therefore, the protection scope of the present disclosure shall be subject to the protection scope of the claims.

What is claimed is:

1. A touch panel, comprising:
   a base;
   sensing electrodes disposed on the base, a sensing electrode in the sensing electrodes including a plurality of first conductive lines that are substantially parallel to each other and a plurality of second conductive lines that are substantially parallel to each other; the plurality of second conductive lines and the plurality of first conductive lines intersecting, and the plurality of second conductive lines electrically connecting the plurality of first conductive lines together; and
   at least two touch lines disposed on the base and crossing the sensing electrode, the at least two touch lines being substantially parallel to the plurality of first conductive lines; wherein
   the at least two touch lines include at least one first touch line electrically connected to the sensing electrode and at least one second touch line not electrically connected to the sensing electrode; an orthographic projection of each second touch line on the base is non-overlapping with orthographic projections of the plurality of first conductive lines in the sensing electrode on the base;
   at least one of the plurality of second conductive lines in the sensing electrode includes a plurality of conductive sections that are disconnected from one another, and at least one conductive section is connected to at least one first conductive line;
   the orthographic projection of the second touch line on the base is non-overlapping with orthographic projections of conductive sections of the plurality of conductive sections in addition to conductive sections for connecting the plurality of first conductive lines together on the base.

2. The touch panel according to claim 1, wherein a first touch line in the at least one first touch line is connected to at least two of the plurality of second conductive lines, and positions of the at least two of the plurality of second conductive lines connected with the first touch line are connected.

3. The touch panel according to claim 1, wherein the sensing electrode includes a first region, and the at least two touch lines and first conductive lines located in the first region are arranged alternately.

4. The touch panel according to claim 3, wherein the sensing electrode further includes a second region located at at least one side of the first region in an extending direction of the plurality of second conductive lines;
   first conductive lines located in the second region are arranged continuously.

5. The touch panel according to claim 4, wherein
   portions of the plurality of second conductive lines located in the second region are connected, and a portion of the at least one of the plurality of second conductive lines in the sensing electrode located in the first region includes the plurality of conductive sections that are disconnected from one another.

6. The touch panel according to claim 4, wherein the sensing electrode includes two second regions, and the two second regions are located at two opposite sides of the first region in the extending direction of the plurality of second conductive lines.

7. The touch panel according to claim 3, wherein the first region is a region occupied by the sensing electrode.

8. The touch panel according to claim 7, wherein the at least two touch lines include a plurality of effective touch lines used for transmitting sensing signals and a plurality of dummy touch lines not used for transmitting sensing signals.

9. The touch panel according to claim 8, wherein the plurality of dummy touch lines are evenly distributed in the first region of the sensing electrode;
   or the first region includes a first sub-region and a second sub-region located at at least one side of the first sub-region in an extending direction of the plurality of second conductive lines; and
   the plurality of effective touch lines are located in the first sub-region, and the plurality of dummy touch lines are located in the second sub-region.

10. The touch panel according to claim 1, wherein the at least two touch lines and the sensing electrode are arranged in different layers;

the touch panel further comprises an insulating layer disposed between the sensing electrode and the at least two touch lines, and a first touch line in the at least one first touch line is connected to the sensing electrode through at least one via hole in the insulating layer.

11. The touch panel according to claim 1, wherein the at least two touch lines and the sensing electrode are arranged in a same layer; positions of each second conductive line intersected with the second touch line are connected;

the second touch line is connected through a bridge at the intersection positions, and an insulating layer is provided between the bridge and the second conductive line;

or, the second conductive line is connected through a bridge at the intersection positions, and an insulating layer is provided between the bridge and the second touch line.

12. The touch panel according to claim 1, wherein at least one first conductive line and at least one second conductive line are bending lines each including a plurality of bending points;

at least one section of the at least one first conductive line is overlapped with at least one section of the at least one second conductive line.

13. The touch panel according to claim 1, wherein at least one touch line is a bending line including a plurality of bending points;

at least one orthographic projection of at least one section of the at least one touch line on the base are overlapped with at least one orthographic projection of at least one section of the at least one second conductive line on the base.

14. A touch display device comprising the touch panel according to claim 1.

15. The touch display device according to claim 14, wherein the touch display device has a display area, and the display area includes a plurality of sub-pixel regions and a pixel defining region for defining the plurality of sub-pixel regions;

the at least two touch lines and the sensing electrodes are located in the pixel defining region.

16. The touch display device according to claim 15, wherein the plurality of first conductive lines in the sensing electrode and the touch lines crossing the sensing electrode form a plurality of line groups, and two adjacent line groups have m sub-pixel regions therebetween, m is greater than or equal to 1, and m is a positive integer;

each line group includes at least one of:
at least one first conductive line, or
at least one touch line.

17. The touch display device according to claim 15, wherein orthographic projections of the sensing electrode and the touch lines crossing the sensing electrode in the touch panel on the base form a plurality of squares, and one sub-pixel region corresponds to one square.

18. The touch display device according to claim 14, wherein the touch display device is a self-luminous display device, and the self-luminous display device further includes a display substrate and an encapsulation layer used for encapsulating the display substrate;

the encapsulation layer is used as the base in the touch panel.

19. The touch panel according to claim 1, wherein the sensing electrode includes a first region, and the at least two touch lines and a plurality of first conductive lines located in the first region are arranged alternately.

* * * * *